(12) United States Patent
Choe et al.

(10) Patent No.: US 8,724,394 B2
(45) Date of Patent: May 13, 2014

(54) NONVOLATILE MEMORY DEVICE AND OPERATING METHOD THEREOF

(75) Inventors: Byeong-In Choe, Yongin-si (KR); Changseok Kang, Seongnam-si (KR); Woonkyung Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 222 days.

(21) Appl. No.: 13/289,463

(22) Filed: Nov. 4, 2011

(65) Prior Publication Data
US 2012/0230103 A1   Sep. 13, 2012

(30) Foreign Application Priority Data

Mar. 7, 2011   (KR) .................. 10-2011-0020029

(51) Int. Cl.
*G11C 11/34* (2006.01)

(52) U.S. Cl.
USPC ................ 365/185.2; 365/189.05; 365/211; 365/230.08

(58) Field of Classification Search
USPC ............. 365/185.2, 211, 189.05, 230.08
See application file for complete search history.

(56) References Cited

U.S. PATENT DOCUMENTS

| | | | |
|---|---|---|---|
| 6,687,178 B1 * | 2/2004 | Qi et al. ................. | 365/211 |
| 7,518,930 B2 * | 4/2009 | Miwa ................. | 365/185.23 |
| 7,729,174 B2 | 6/2010 | Lee | |
| 7,755,965 B2 * | 7/2010 | Chen et al. .............. | 365/211 |
| 2008/0192536 A1 | 8/2008 | Lee | |
| 2009/0290432 A1 | 11/2009 | Park | |

FOREIGN PATENT DOCUMENTS

| | | |
|---|---|---|
| KR | 20080076006 A | 8/2008 |
| KR | 100908533 B1 | 7/2009 |
| KR | 20100060933 A | 6/2010 |

* cited by examiner

*Primary Examiner* — Son Dinh
(74) *Attorney, Agent, or Firm* — Harness, Dickey & Pierce, P.L.C.

(57) ABSTRACT

According to example embodiments, a nonvolatile memory device includes a substrate, at least one string extending vertically from the substrate, and a bit line current controlling circuit connected to the at least one string via at least one bit line. The at least one string may include a channel containing polycrystalline silicon. The bit line current controlling circuit may be configured to increase the amount of current being supplied to the bit line according to a decrease in a temperature such that a current flowing through the channel of the at least one string is increased when a temperature decreases.

17 Claims, 33 Drawing Sheets

NONVOLATILE MEMORY DEVICE AND OPERATING METHOD THEREOF

CROSS-REFERENCE TO RELATED APPLICATIONS

This application claims priority under 35 U.S.C §119 to the benefit of Korean Patent Application No. 10-2011-0020029 filed Mar. 7, 2011, the entire disclosure of which is incorporated by reference herein.

BACKGROUND

Example embodiments relate to a semiconductor device, and more particularly to a semiconductor device using a polycrystalline silicon material as a transistor channel.

Semiconductor elements, such as resistors, capacitors, transistors, memory cells, solar cells, etc. may be made up of a single crystalline silicon material and/or a polycrystalline silicon material. Electrical properties of such semiconductor elements may vary according to various conditions such as temperature, concentration, etc. Variations of electric properties may affect the reliability of a semiconductor device including such semiconductor elements. For this reason, various technologies for improving the reliability of semiconductor devices are being investigated.

SUMMARY

Example embodiments of inventive concepts relate to a nonvolatile memory device including a substrate, at least one string extending vertically from the substrate, and a bit line current controlling circuit connected with the at least one string via a bit line. The at least one string includes a channel containing a polycrystalline silicon material. The bit line current controlling circuit may be configured to increase an amount of current being supplied to the bit line according to a decrease in a temperature such that a current flowing through a channel of the at least one string is increased when the temperature decreases.

The at least one string may further include a plurality of gate structures on the channel, the plurality of gate structures forming memory transistors with the channel.

The device may be configured to increase a current flowing through at least one of the memory transistors increases when the amount of current being supplied to the at least one bit line increases.

The bit line current controlling circuit is configured to control the amount of current being supplied to the bit line during an operation where a state of a selected one of the memory cells is judged.

The operation may include one of a read operation, a program verification operation, and an erase verification operation.

A voltage being applied to the plurality of gate structures are not adjusted according to a decrease in a temperature.

The bit line current controlling circuit may include a latch unit connected with a sensing node, an NMOS transistor connected between the bit line and the sensing node and configured to operate in response to a control signal, a load unit configured to supply a current to the sensing node, and a control signal generator configured to generate the control signal. The control signal generator may be configured to control a voltage of the control signal so as to increase the amount of current flowing through the NMOS transistor when the temperature decreases.

The control signal generator may be configured to a control a voltage of the control signal when a temperature of the nonvolatile memory device is lower than a reference temperature.

Example embodiments of inventive concepts relate to a read method of a nonvolatile memory device including a substrate, bit lines, and strings extending vertically to the substrate, the strings connected with the bit lines, respectively, and the strings including channels containing a polycrystalline silicon material. The read method may include supplying a pre-charge current to the bit lines during a pre-charge interval, supplying a sensing current to the bit lines during a sensing interval, and latching a voltage variation of each bit line as cell data, wherein the pre-charge and sensing currents are increased according to a decrease in a temperature such that currents flowing through channels of the strings are increased at a decrease in a temperature.

Each of the strings may further include a plurality of gate structures formed on the channels, the plurality of gate structures forming memory transistors with the channels. The method may further include increasing a current flowing through the memory transistors when the amount of current being supplied to a bit line increases.

The method does not include adjusting voltages applied to the plurality of gate structures adjusted according to a decrease in a temperature.

The method may include adjusting the pre-charge and sensing currents when a temperature of the nonvolatile memory device is lower than a reference temperature.

According to example embodiments of inventive concepts a nonvolatile memory device includes a substrate, strings extending vertically from the substrate, each string including a channel formed of a polycrystalline silicon material, a plurality of gate structures on the channel, and a page buffer controlling circuit configured to control the page buffers so as to adjust the amount of current being supplied to each bit line according to a temperature variation.

The page buffer controlling circuit may be configured to control the page buffers so as to increase the amount of current being supplied to each bit line according to a decrease in a temperature and a current flowing through a channel of each string is increased according to the amount of current being supplied to each bit line at a decrease in a temperature.

The page buffer controlling circuit may include a reference voltage generator configured to generate a reference voltage under a control of a control logic, and a temperature compensator configured to receive the reference voltage to generate a control signal having a voltage varied according to a temperature variation. Each of the page buffers may include an NMOS transistor connected between a corresponding bit line and a sensing node and configured to operate responsive to the control signal. The page buffer controlling circuit may further include a load unit configured to supply a current to the sensing node, and a latch unit configured to latch a voltage level of the sensing node as cell data. A voltage of the control signal may be increased at a decrease in a temperature such that the amount of current being supplied to a corresponding bit line is increased.

The page buffer controlling circuit may include a temperature detector configured to generate a selection signal indicating whether a temperature of the nonvolatile memory device is lower than a reference temperature, a reference voltage generator configured to generate a reference voltage under a control of a control logic, a temperature compensator configured to receive the reference voltage and to generate a signal having a voltage varied according to a temperature variation, and a selector configured to select one of the reference voltage and a voltage varied according to a temperature variation to output a control signal having the selected voltage. Each of the page buffers may include an NMOS transistor connected between a bit line and a sensing node and configured to operate in response to the control signal, a load unit configured to supply a current to the sensing node, and a latch unit configured to latch a voltage level of the sensing node as cell data. The voltage may be varied according to a temperature variation to be increased at a decrease in a temperature such that the amount of current being supplied to a corresponding bit line is increased.

According to example embodiments of inventive concepts, a memory card includes at least one of the foregoing nonvolatile memory devices, a controller including a buffer memory and configured to control the nonvolatile memory device, and an interface unit configured to provide an interface function between the controller and an external device, page buffers connected with bit lines corresponding to the strings, respectively; and The page buffer controlling circuit may be configured to control the page buffers so as to adjust the amount of current being supplied to each bit line according to a temperature variation. The page buffer controlling circuit may include a reference voltage generator configured to generate a reference voltage under a control of a control logic, and a temperature compensator configured to receive the reference voltage to generate a control signal having a voltage varied according to a temperature variation Each of the page buffers may include an NMOS transistor connected between a corresponding bit line and a sensing node and configured to operate in response to the control signal, a load unit configured to supply a current to the sensing node, and a latch unit configured to latch a voltage level of the sensing node as cell data. A voltage of the control signal may be increased at a decrease in a temperature such that the amount of current being supplied to a corresponding bit line is increased.

According to example embodiments of inventive concepts, a solid state drive includes a storage medium including at least one of the foregoing nonvolatile memory devices, and a controller connected with the storage medium via a plurality of channels and configured to control the storage medium, page buffers connected with bit lines corresponding to the strings, respectively, and a page buffer controlling circuit configured to control the page buffers so as to adjust the amount of current being supplied to the bit lines according to a temperature variation. The page buffer controlling circuit may include a temperature detector configured to generate a selection signal indicating whether a temperature of the nonvolatile memory device is lower than a reference temperature, a reference voltage generator configured to generate a reference voltage under a control of a control logic, a temperature compensator configured to receive the reference voltage and to generate a signal having a voltage varied according to a temperature variation, and a selector configured to select one of the reference voltage and a voltage varied according to a temperature variation to output a control signal having the selected voltage. Each of the page buffers may include an NMOS transistor connected between a corresponding bit line and a sensing node and configured to operate responsive to the control signal, a load unit configured to supply a current to the sensing node. and a latch unit configured to latch a voltage level of the sensing node as cell data. The voltage may be varied according to a temperature variation being increased at a decrease in a temperature such that the amount of current being supplied to a corresponding bit line is increased.

According to example embodiments of inventive concepts, a non-volatile memory device includes an array including a plurality of memory cells. Each memory cell may include a channel containing polycrystalline silicon, a bit line connected to at least one of the plurality of memory cells, and a bit line current controlling circuit configured to adjust a current supplied to the bit line in order to compensate for a temperature-current variation of the channel.

The bit line current controlling circuit may include a page buffer circuit connected to the bit line, a control signal generator configured to generate a control signal applied to the page buffer circuit, and the page buffer circuit may be configured to adjust the current supplied to the bit line based on the control signal.

The control signal generator may include a reference voltage generator connected to a temperature compensator. The reference voltage generator may be configured to generate a reference voltage. The temperature compensator may be configured to generate a voltage of the control signal based on comparing a default temperature to a temperature sensed by the temperature compensator, wherein the temperature compensator is configured to generate the voltage of the control signal to be higher than the reference voltage when the temperature sensed by the temperature compensator is less than the default temperature.

At least two memory cells of the plurality of memory cells may be vertically stacked to form a string between a substrate and the bit line. The channel of each of the at least two memory cells may be a portion of a surface layer containing polycrystalline silicon that extends vertically between the substrate and the bit line. An insulation material may separate adjacent memory cells of the at least two memory cells along a height direction of the surface layer. Each memory cell of the at least two memory cells may include a control gate and at least one insulation layer between the control gate and the channel containing polycrystalline silicon.

BRIEF DESCRIPTION OF THE FIGURES

The foregoing and other features and advantages of inventive concepts will become apparent from the following description with reference to the following figures of non-limiting embodiments of inventive concepts, where like reference numerals refer to like parts throughout the various figures unless otherwise specified. The drawings are not necessarily to scale, emphasis instead being placed upon illustrating the principles of inventive concepts. In the drawings.

DETAILED DESCRIPTION

Figure 1:
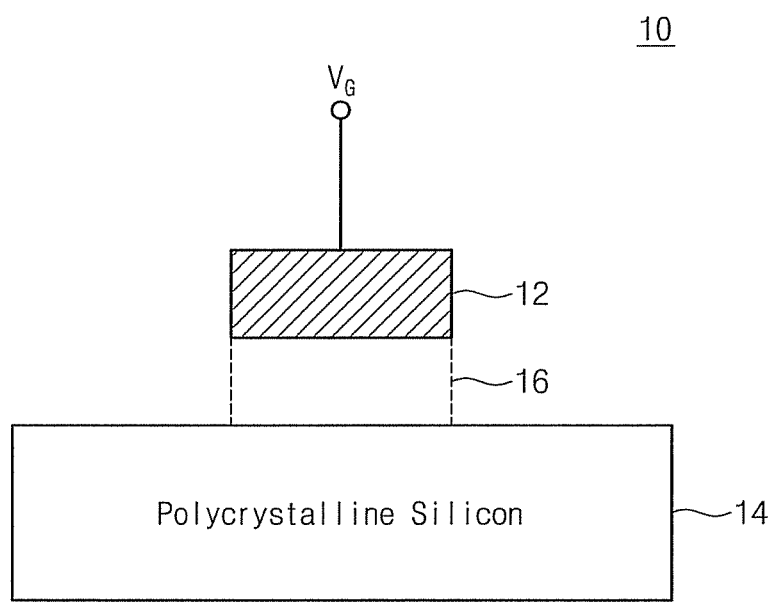
FIG. 1 is a cross section view illustrating a semiconductor element according to example embodiments of inventive concepts.

Example embodiments of inventive concepts will now be described more fully hereinafter with reference to the accompanying drawings, in which some example embodiments of inventive concepts are shown. Example embodiments may, however, be embodied in many different forms and should not be construed as limited to the embodiments set forth herein. Rather, these example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout, and thus their description will be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the Example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on" "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all twins (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross section view illustrating a semiconductor element according to example embodiments of inventive concepts.

Referring to FIG. 1, a semiconductor element 10 may be a transistor which is formed of a polycrystalline silicon material. The polycrystalline silicon material may be an undoped or lightly doped polycrystalline silicon material. For example, the concentration of at least one dopant in the polycrystalline silicon material may be about 1E16/cm-3 to 1E19/cm-3, but example embodiments are not limited thereto. The semiconductor element 10 may have a gate 12 configured to receive a control voltage $V_G$. An insulation film 16 may be interposed between the gate 12 and a body 14 of the semiconductor element 10. The gate 12 and the insulation film 16 may constitute a gate structure. The insulation film 16 may be formed of one or more material films. The insulation film 16 may be used as a gate insulation film or a charge storage film. In a case where the insulation film 16 is used as a gate insulation film, the semiconductor element 10 may act as a switching transistor. If the insulation film 16 is used as a charge storage film, the semiconductor element may function as a memory transistor (or, a memory cell) storing data information. An electric property (e.g., a temperature-current property) of a semiconductor element whose channel is formed of a polycrystalline silicon material may be different from that of a semiconductor element whose channel is formed of a single crystalline silicon material. This will be more fully described later. When the semiconductor element 10 is used as a memory transistor (or, a memory cell), for example, a read margin (or, a sensing margin) may be reduced due to a variation of its electric property (e.g., a temperature-current property); consequently, program fails, read fails, erase fails, etc. may arise. Various technologies for compensating a temperature-current property of a semiconductor element having a channel formed of a single crystalline silicon material may be used to compensate a reduction of the read margin. However, it is difficult to compensate a temperature-current property of a semiconductor element whose channel is formed of a polycrystalline silicon material, based upon such technologies. This may be because electrical properties between the semiconductor elements formed of a polycrystalline silicon material and a single crystalline silicon material are different from each other.

Figure 2A:
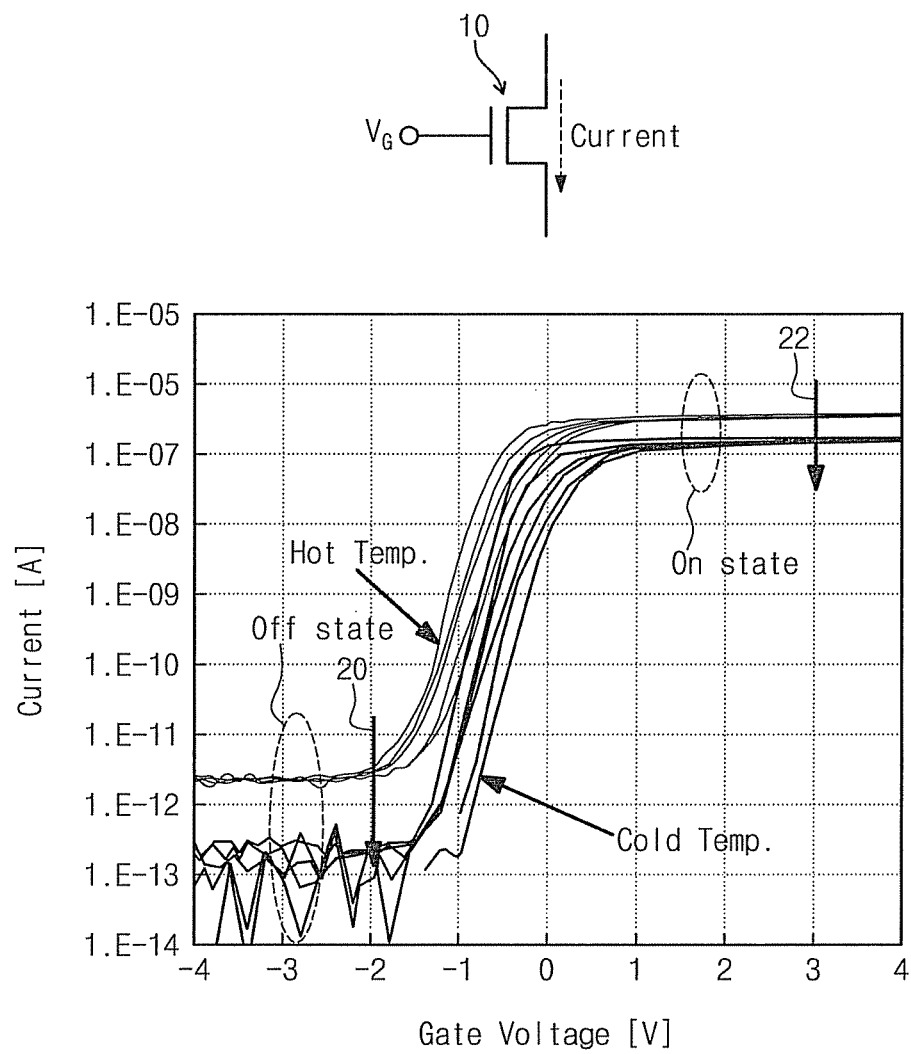
FIG. 2A is a diagram for describing a gate voltage-current property of a semiconductor element shown in FIG. 1 at a temperature variation.
Figure 2B:
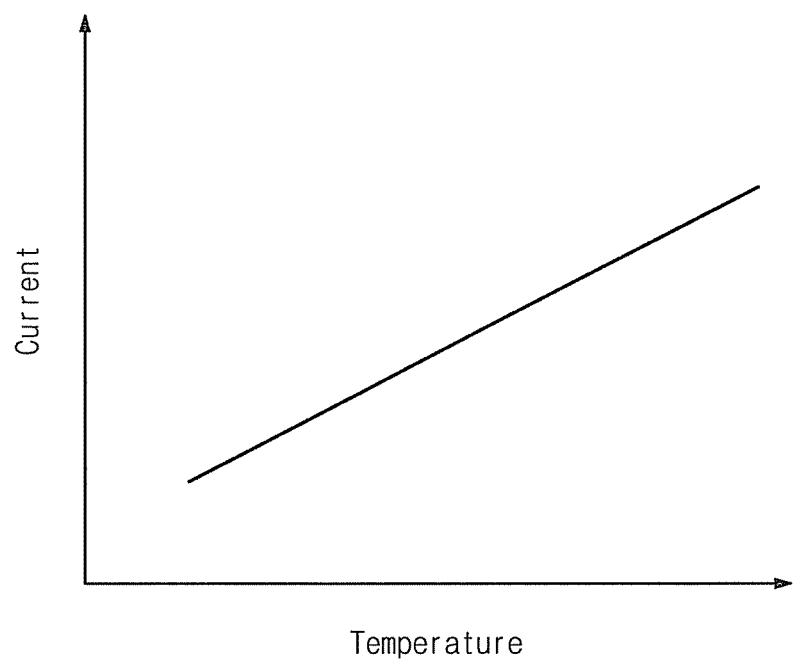
FIG. 2B is a diagram for describing a variation of current flowing via a semiconductor element shown in FIG. 1 at a temperature variation.

FIG. 2A is a diagram for describing a gate voltage-current property of a semiconductor element shown in FIG. 1 at a temperature variation, and FIG. 2B is a diagram for describing a variation of current flowing via a semiconductor element shown in FIG. 1 at a temperature variation. Hereinafter, a current flowing when a semiconductor element shown in FIG. 1 is turned on may be referred to as a "turn-on current", and a current flowing when a semiconductor element shown in FIG. 1 is turned off may be referred to as a "turn-off current".

Whether the semiconductor element 10 is turned on or turned off may be determined in accordance with a difference between the turn-on current and the turn-off current. This may mean that a difference between the turn-on current and the turn-off current is kept by a desired (or alternatively predetermined) value regardless of a temperature variation. For example, as illustrated in FIG. 2A, the turn-off current may decrease when a temperature is lowered to a cold temperature from a hot temperature (refer to an arrow 20 in FIG. 2A). Likewise, the turn-on current may decrease when a temperature is lowered to a cold temperature from a hot temperature (refer to an arrow 22 in FIG. 2A). That is, a difference between the turn-on current and the turn-off current is kept by a desired (or alternatively predetermined) value regardless of a temperature variation. In case of a semiconductor element whose channel is formed of a polycrystalline silicon material, as illustrated in FIGS. 2A and 2B, the turn-on current of the semiconductor element 10 may decrease in accordance with a decrease in a temperature. On the other hand, in case of a semiconductor element whose channel is formed of a single crystalline silicon material, the turn-on current of the semiconductor element 10 may increase when a temperature decrease.

With the above description, a temperature-current characteristic of a semiconductor element whose channel is formed of a single crystalline silicon material may be different from that of a semiconductor element whose channel is formed of a polycrystalline silicon material. That is, when a temperature decreases, a current (or, an on-cell current) flowing via a memory cell of a single crystalline silicon channel may increase while a current (or, an on-cell current) flowing via a memory cell of a polycrystalline silicon channel may decrease. When a temperature decreases, a threshold voltage of a semiconductor element may increase. In case of a polycrystalline silicon channel, the scattering effect according to a decrease in a temperature may be reduced, and the mobility may be reduced due to an increase in a barrier of the poly grain boundary. For this reason, a current flowing via a semiconductor element having a polycrystalline silicon channel may decrease in accordance with a decrease in a temperature.

For a semiconductor memory device using semiconductor elements having a single crystalline silicon channel as memory transistors, a technique of adjusting a gate voltage may be used to compensate for a variation of a threshold voltage according to a temperature variation. For example, a gate voltage may be increased to compensate for an increase in a threshold voltage according to a decrease in a temperature. A gate voltage may be lowered to compensate for a decrease in a threshold voltage according to an increase in a temperature. The technique of adjusting a gate voltage may be applied to a semiconductor memory device which uses semiconductor elements having a single crystalline silicon channel as memory transistors.

For a semiconductor memory device using semiconductor elements having a single crystalline silicon channel as memory transistors, a current flowing via a channel may increase at a decrease in a temperature. For this reason, a stable sensing margin may be secured by increasing a gate voltage in proportion to an increase in a threshold voltage. For a semiconductor memory device using semiconductor elements having a polycrystalline silicon channel as memory transistors, it may be difficult to secure a stable sensing margin although a gate voltage increases in proportion to an increase in a threshold voltage. This may be because a current flowing via a channel decreases at a decrease in a temperature. In other words, since a current flowing via a bit line decrease, a turned-on memory transistor may be judged to be turned off. For this reason, it may be difficult to apply the above-described gate voltage adjusting manner to a semiconductor memory device using semiconductor elements having a polycrystalline silicon channel as memory transistors. Further, the gate voltage adjusting manner may cause deterioration of a read disturbance property of a semiconductor memory device.

Below, a nonvolatile memory device using a semiconductor element 10 in FIG. 1 as a memory transistor and its operating method will be more fully described.

Figure 3:
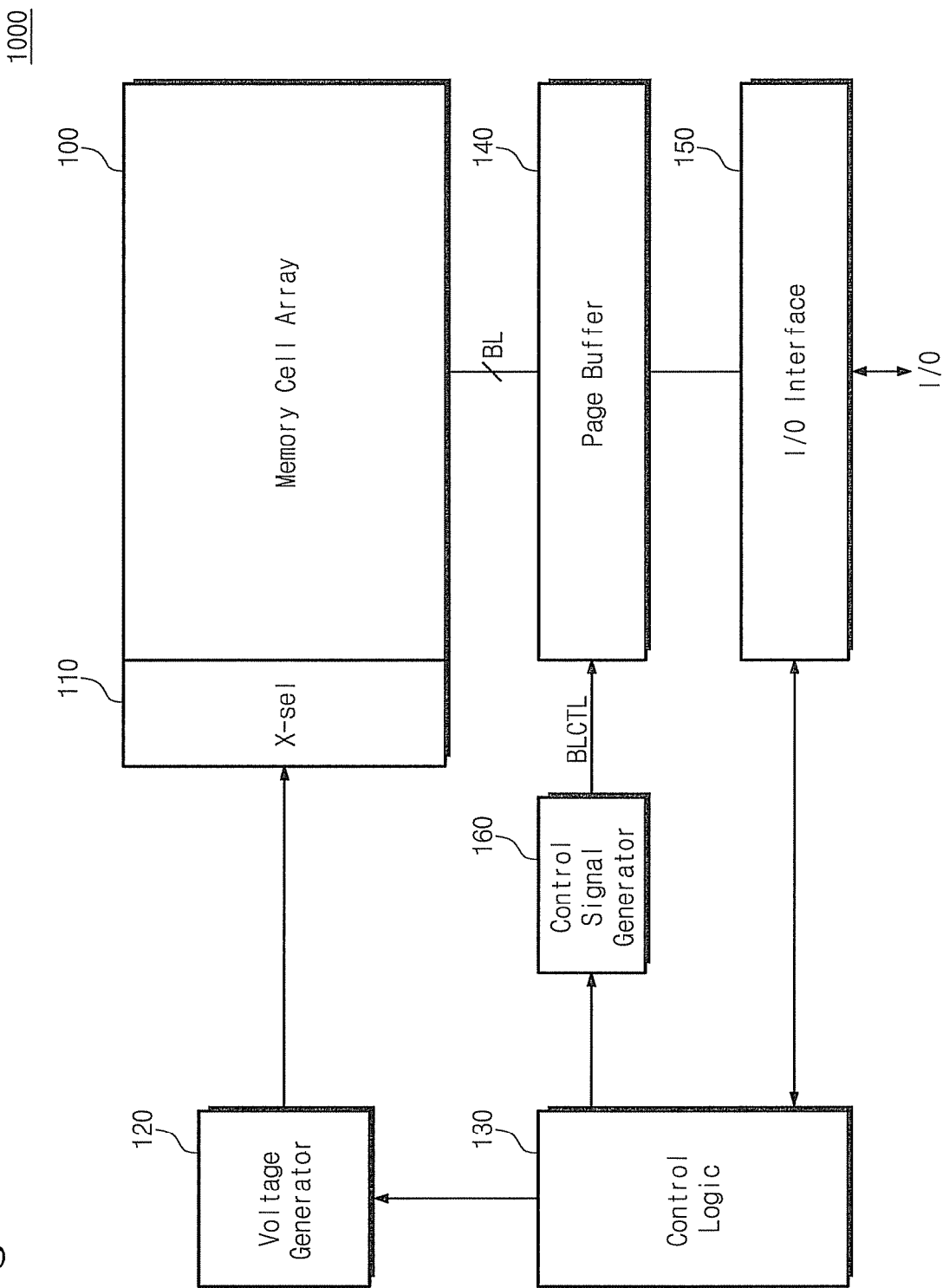
FIG. 3 is a block diagram illustrating a nonvolatile memory device according to example embodiments of inventive concepts.
Figure 4:
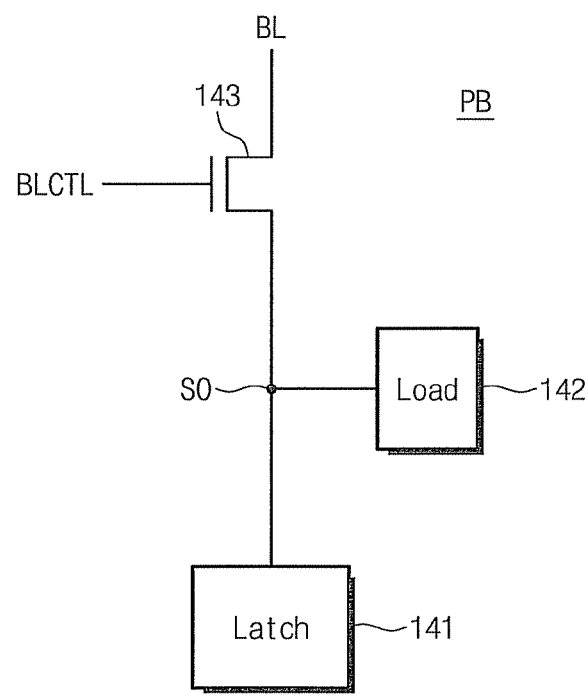
FIG. 4 is a block diagram illustrating a part of a page buffer circuit illustrated in FIG. 3.

FIG. 3 is a block diagram illustrating a nonvolatile memory device according to example embodiments of inventive concepts, and FIG. 4 is a block diagram illustrating a part of a page buffer circuit illustrated in FIG. 3.

Referring to FIG. 3, a nonvolatile memory device 1000 may include a memory cell array 100 which has memory cells arranged in rows (or, word lines) and columns (or, bit lines). Each of the memory cells may be formed of a semiconductor element 10 described in relation to FIG. 1, but example embodiments are not limited thereto. In this case, an insulation film 16 of the semiconductor element 10 may include a charge storage film such as a floating gate or a charge trap film. Each memory cell may store one bit of data or M bits of data (M being a positive integer of 2 or more). The memory cells of the memory cell array 100, for example, may be arranged to form strings. The strings may be formed to be perpendicular to a substrate. The substrate may be formed of single crystalline silicon material, but example embodiments are not limited thereto. The string structure will be more fully described later. Since each memory cell may be formed of the semiconductor element 10 described in relation to FIG. 1, channels (or, called string channels) of memory cells of each string may be formed of a polycrystalline silicon material. In this case, a current flowing via string channel may decrease when a current temperature is lowered on the basis of a default temperature. Herein, the default temperature may be the highest temperature of an allowable temperature range (e.g., 90° C.~40° C.) of the nonvolatile memory device. However, the default temperature is not limited thereto. For example, the default temperature may be the lowest and/or an intermediate temperature of an allowable temperature range of the nonvolatile memory device.

A row selector circuit 110 may be configured to drive rows of the memory cell array 100 with a voltage (e.g., a word line voltage) from a voltage generator circuit 120. The voltage generator circuit 120 may operate in response to the control of control logic 130, and may generate a voltage (e.g., a word line voltage) to be supplied to the memory cell array 100 via the row selector circuit 110. A word line voltage generated by the voltage generator circuit 120 may include a read voltage, a program voltage, an erase voltage, a verification voltage, and the like. The control logic 130 may control an overall operation of the nonvolatile memory device 1000. A page buffer circuit 140 may be controlled by the control logic 130, and may be configured to read data from selected memory cells of the memory cell array 100 via columns (or, bit lines) at a read operation. The page buffer circuit 140 may be configured to drive columns (or, bit lines) according to data to be stored in selected memory cells of the memory cell array 100 at a program operation (or, a write operation).

The page buffer circuit 140 may include page buffers corresponding to the columns (or, the bit lines), respectively. Each page buffer PB, as illustrated in FIG. 4, may include a latch unit 141, a load unit 142, and an NMOS transistor 143.

The latch unit 141 may be connected with a sensing node SO, and may be used to temporarily store data to be stored in a memory cell connected with a bit line BL (or, a selected memory cell of a string) and to temporarily store data read from a memory cell via a bit line BL (or, a selected memory cell of a string). The latch unit 141, although not shown in figures, may include a plurality of latches. The latch unit 141 may be configured to store a logic state of the sensing node SO as data read from a memory cells under the control of the control logic 130. The load unit 142 may be connected with the sensing node SO, and may be configured to supply a current to the bit line BL via the NMOS transistor 143. For example, although not shown in figures, the load unit 142 may be formed of a PMOS transistor connected between a power supply voltage and the sensing node SO. The NMOS transistor 143 may connect the bit line BL and the sensing node SO in response to a control signal BLCTL.

The amount of current (or, a bit line voltage) being supplied to the bit line BL may be determined by a voltage of the control signal BLCTL applied to the NMOS transistor 143. While FIG. 4 illustrate a non-limiting example of a page buffer PB, a structure of the page buffer PB in a non-volatile memory device according to example embodiments is not limited thereto. For example, the page buffer PB may be configured to be shared by a pair of bit lines. In this case, the page buffer PB may include a circuit of selecting one of the pair of bit lines.

Returning to FIG. 3, an input/output interface circuit 150 may operate responsive to the control of the control logic 130, and may be configured to interface with an external device (e.g., a memory controller or a host). For example, the input/output interface circuit 150 may provide a data path between the external device and the page buffer circuit 140 at data input/output. The input/output interface circuit 150 may provide a data path between the external device and the control logic 130 at command input. Although not illustrated in FIG. 3, the input/output interface circuit 150 may include a column selector, input/output buffers, and the like.

The nonvolatile memory device 1000 according to example embodiments of inventive concepts may further include a control signal generator circuit 160. The control signal generator circuit 160 may be controlled by the control logic 130, and may be configured to generate the control signal BLCTL being applied to the page buffer circuit 140 (or, the NMOS transistor 143 of each page buffer PB). For example, when a temperature decreases, the control signal generator circuit 160 may control the control signal BLCTL such that the amount of current being supplied to a bit line increases. In other words, when a temperature decreases, a voltage of the control signal BLCTL may increase such that the amount of current being supplied to a bit line increases (or, a voltage of a bit line increases). This may mean that a sensing margin reduced due to a cell current lowered at a temperature variation is compensated.

As above described, when a temperature decreases, there may be increased the amount of current flowing via a channel (i.e., a polycrystalline silicon channel) of a string including a selected memory cell. In a non-volatile memory device according to embodiments, a voltage of the control signal BLCTL may increase when a temperature decreases. As a voltage of the control signal BLCTL increases, the amount of current flowing via the NMOS transistor 143 of the page buffer PB may increase. This may mean that a current (or, a bit line current) reduced due to a temperature variation is compensated. A sensing margin (or, a read margin) may be secured by compensating the reduced current. In particular, controlling of a current being supplied to a bit line for compensation of a reduced current may be distinguished from a manner that compensation of a reduced current is made by adjusting a gate voltage (e.g., a word line voltage) applied to a memory cell. Adjustment of a gate voltage may cause deterioration of the read disturbance property, while compensation of a current supplied to a bit line may not cause deterioration of the read disturbance property.

In example embodiments, compensation of a current supplied to a bit line may be made according to a temperature variation or according to a temperature variation when a current temperature is lowered on the basis of a specific temperature. This will be more fully described later.

In example embodiments, the control logic 130, the page buffer circuit 140, and the control signal generator circuit 160 may constitute a bit line current controlling circuit which is connected with at least one string via a bit line. The bit line current controlling circuit may increase the amount of current being supplied to a bit line according to a decrease in a temperature such that the amount of current flowing via a channel of at least one string increases at a decrease in a temperature.

In example embodiments, the control logic 130 and the control signal generator circuit 160 may constitute a page buffer controlling circuit which controls page buffers so as to adjust the amount of current being supplied to bit lines according to a temperature variation. The page buffer controlling circuit may control page buffers so as to increase the amount of current being supplied to bit lines according to a decrease in a temperature, so that currents flowing to channels of strings increase in amount according to the amount of current being supplied to bit lines at a decrease in a temperature.

Figure 5:
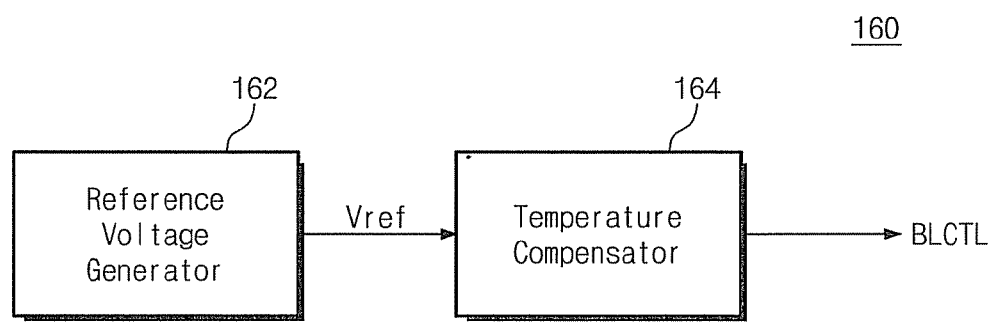
FIG. 5 is a block diagram illustrating a control signal generator circuit in FIG. 3 according to example embodiments of inventive concepts.

FIG. 5 is a block diagram illustrating a control signal generator circuit in FIG. 3 according to example embodiments of inventive concepts.

Referring to FIG. 5, a control signal generator circuit 160 may include a reference voltage generator 162 and a temperature compensator 164. The reference voltage generator 162 may be configured to generate a reference voltage Vref for adjusting a voltage of a control signal BLCTL. The reference voltage Vref may be set to different voltages (e.g., 1.8V and 1.3V, but example embodiments are not limited thereto) at a pre-charge and a sensing period of a read operation. The temperature compensator 164 may be configured to generate the control signal BLCTL in response to the reference voltage Vref. In particular, the temperature compensator 164 may be configured to compensate a voltage of the control signal BLCTL according to a temperature variation. For example, when a current temperature is a default temperature, a voltage of the control signal BLCTL may be identical to the reference voltage Vref. When a current temperature is lower than the default temperature, a voltage of the control signal BLCTL may be compensated to become higher than the reference voltage Vref. That is, when a temperature decreases, a voltage of the control signal BLCTL may increase such that the amount of current being supplied to a bit line (or, a bit line voltage) increases. This may mean that a cell current reduced due to a decrease in a temperature is compensated by an increase in a bit line voltage (or, an increase in a bit line current). That is, although a temperature varies, a cell current may be kept constantly by compensation of a bit line voltage (or, compensation of a bit line current). Accordingly, it is possible to stably secure a read margin (or, a sensing margin).

In a non-volatile memory device according to example embodiments, the reference voltage Vref may be changed variously according to a mode of operation such as a program verification operation, an erase verification operation, and the like.

Figure 6:
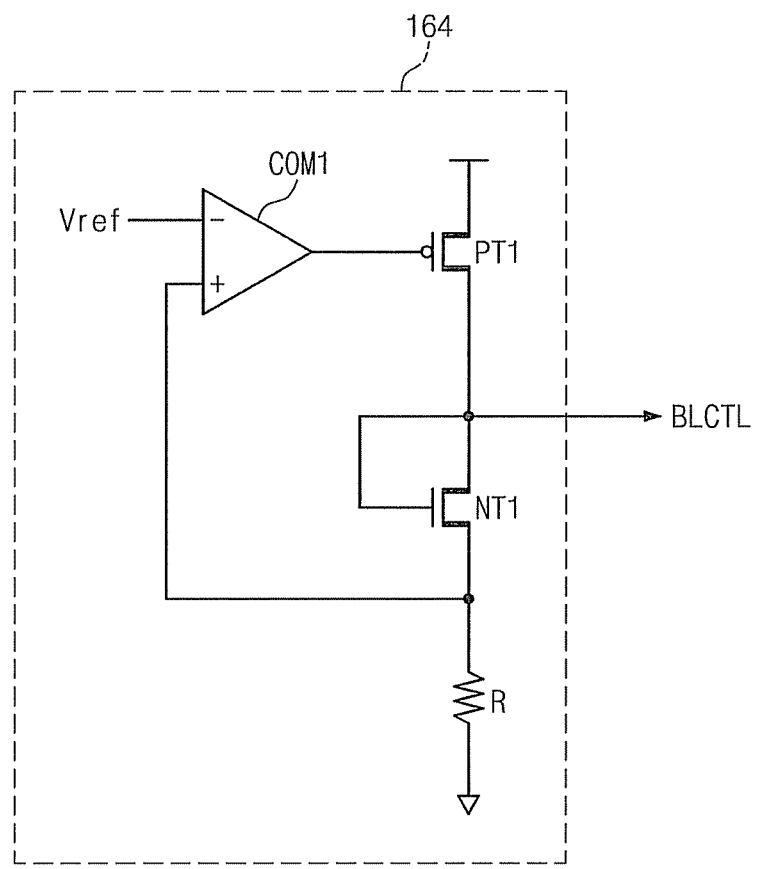
FIG. 6 is a circuit diagram illustrating a temperature compensator illustrated in FIG. 5.

FIG. 6 is a circuit diagram illustrating a temperature compensator illustrated in FIG. 5.

Referring to FIG. 6, a temperature compensator 164 may be configured to generate a control signal BLCTL in response to a reference voltage Vref. The temperature compensator 164 may include a comparator COM1, a PMOS transistor PT1, an NMOS transistor NT1, and a resistor R, which are connected as illustrated in FIG. 6. It is well comprehended that a structure of the temperature compensator 164 is not limited to the illustration in FIG. 6. The NMOS transistor NT1 may be used as a variable resistor which has resistance varied according to a temperature variation. A voltage of the control signal BLCTL may be determined according to the following equation.

$$BLCTL = (1 + Rt/R)V_{ref} \quad (1)$$

In this equation, a resistance value Rt of the NMOS transistor NT1 may be proportional to a threshold voltage. That is, if a threshold voltage of the NMOS transistor NT1 varies according to a temperature variation, the resistance value Rt may vary in proportion to a variation of a threshold voltage. A threshold voltage of the NMOS transistor NT1 may decrease according to an increase in a temperature, so that a resistance value Rt being variable decreases. A threshold voltage of the NMOS transistor NT1 may increase according to a decrease in a temperature, so that the resistance value Rt increases. Accordingly, a voltage of the control signal BLCTL may vary according to a temperature. That is, a voltage of the control signal BLCTL may be lowered when a temperature increases, and may become higher when a temperature decreases. As a voltage of the control signal BLCTL increases at a decrease in a temperature, the amount of current being supplied to a bit line (or, a bit line voltage) may increase.

Figure 7:
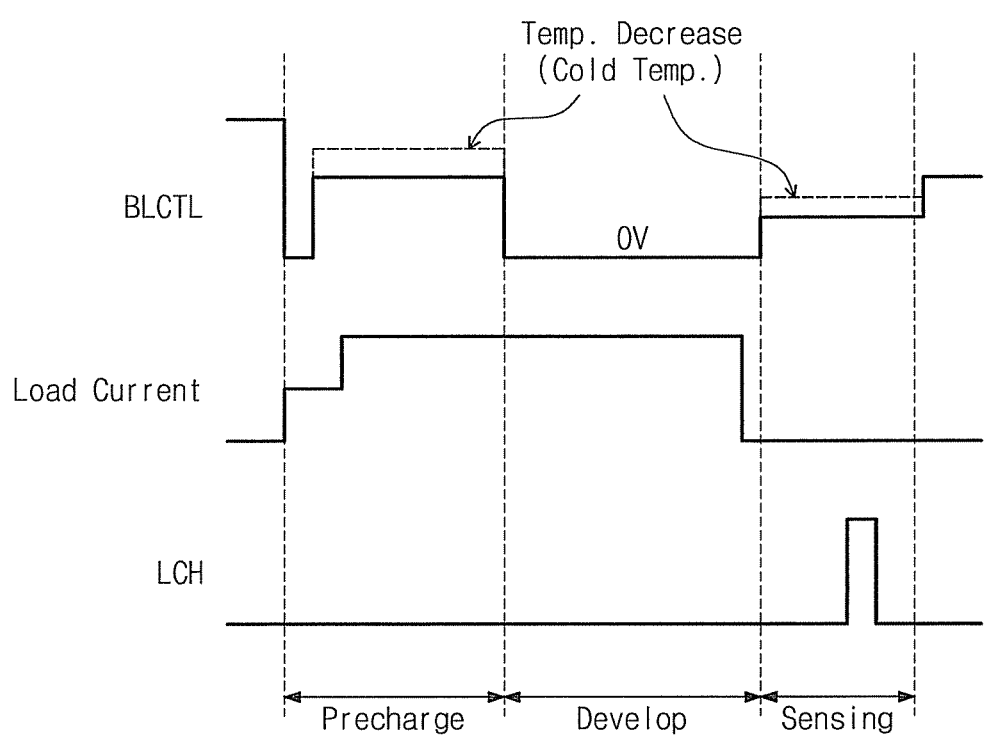
FIG. 7 is a timing diagram for describing a read operation of a nonvolatile memory device according to example embodiments of inventive concepts.

FIG. 7 is a timing diagram for describing a read operation of a nonvolatile memory device according to example embodiments of inventive concepts. Below, a read operation of a nonvolatile memory device according to example embodiments of inventive concepts will be more fully described with reference to accompanying drawings. A read operation may include a pre-charge interval, a develop interval, and a sensing interval. For ease of description, a read operation will be described on the basis of a page buffer PB illustrated in FIG. 4.

As illustrated in FIG. 7, during pre-charge and develop intervals, a constant current may be supplied to a sensing node SO from a load unit 142. A current supplied from the load unit 142 may be provided to a bit line BL via an NMOS transistor 143. At the pre-charge and sensing intervals, a voltage of a control signal BLCTL may be determined by a reference voltage Vref. For example, the reference voltage Vref supplied at the pre-charge interval may be about 1.8V, and the reference voltage Vref supplied at the sensing interval may be about 1.3V. It is well understood that values of the reference voltage Vref are not limited to this disclosure.

During the pre-charge interval, a bit line pre-charge current may be supplied to the bit line BL via the NMOS transistor 143 controlled by the control signal BLCTL. After the bit line BL is pre-charged, the control signal BLCTL may be set to a voltage of 0V. This may mean that the bit line BL is electrically isolated from the sensing node SO. During the develop interval, a pre-charge voltage of the bit line BL may be discharged or maintained according to a state (an erase state or a program state) of a selected memory cell. During the sensing interval, as a voltage of the control signal BLCTL is set to a desired (or alternatively predetermined) voltage, the bit line BL may be electrically connected with the sensing node SO. At this time, a voltage of the sensing node SO may be determined according to a voltage of the bit line BL. For example, when the bit line BL is connected with a memory cell having an erase state, a voltage of the sensing node SO may be discharged to a ground voltage. When the bit line BL is connected with a memory cell having a program state, a voltage of the sensing node SO may be maintained without a variation (or, may be lowered slightly). Afterwards, a latch unit 141 may latch a logic state of the sensing node SO as data in response to a latch signal LCH.

As illustrated by a dotted line in FIG. 7, a voltage of the control signal BLCTL may increase at the pre-charge and sensing intervals when a temperature decreases. A voltage of the control signal BLCTL illustrated by a solid line in FIG. 7 may be determined on the basis of a default temperature. That is, as a temperature decreases, a voltage of the control signal BLCTL may increase. As a temperature decreases, a current flowing via a memory cell having a polycrystalline silicon channel may be reduced as described above. Accordingly, the reduced current of a memory cell having a polycrystalline silicon channel may be compensated by increasing the amount of current supplied to a bit line BL (or, increasing a bit line voltage). This may mean that although a temperature is lowered, a sensing margin (or, a read margin) is not reduced.

In a nonvolatile memory device according to according to example embodiments, the above-described read operation may include supplying a pre-charge current to bit lines during a pre-charge interval, supplying a sensing current to bit lines during a sensing interval, and latching a voltage variation of each bit line as data. The pre-charge and sensing currents may be increased according to a decrease in a temperature so as to increase a current flowing via channels of strings.

Figure 8:
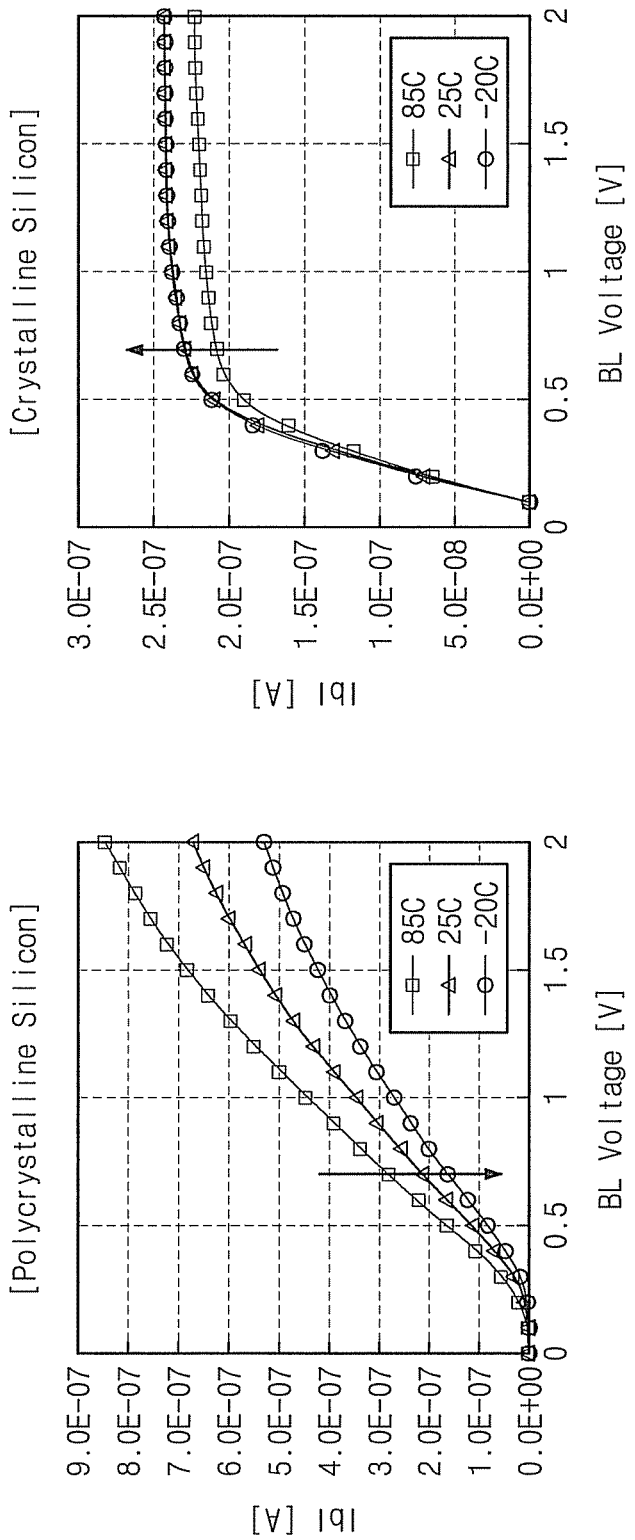
FIG. 8 is a diagram illustrating a variation of a bit line current according to a temperature variation when channels of memory cells are formed using a polycrystalline silicon material and a single crystalline silicon material.
Figure 9:
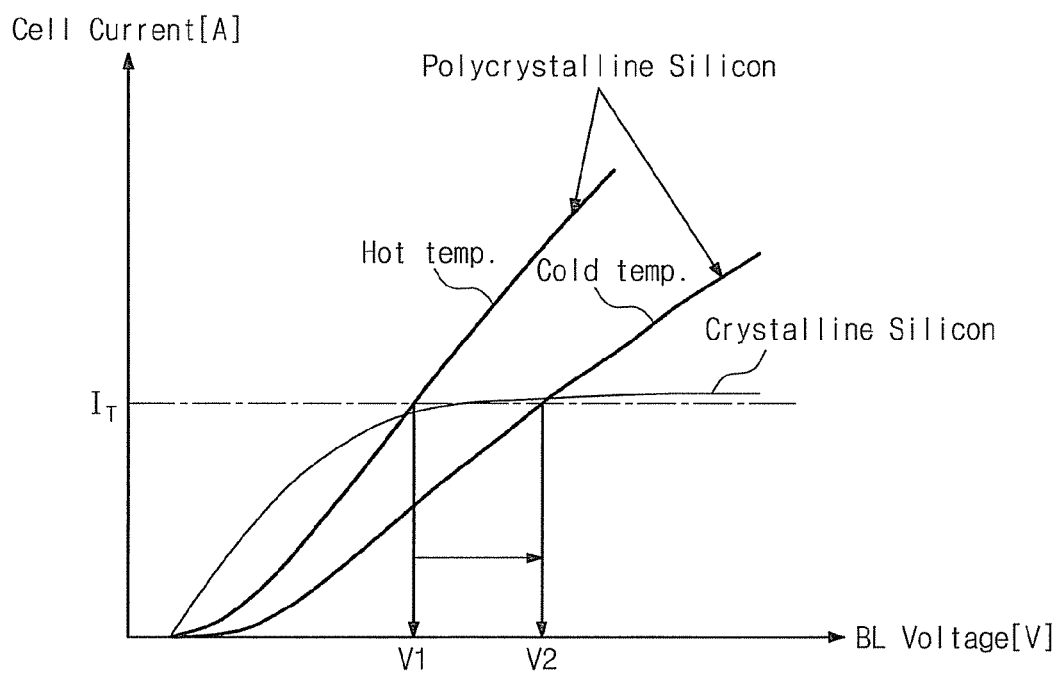
FIG. 9 is a diagram for describing a bit line voltage to cell current variation when channels of memory cells are formed using a polycrystalline silicon material and a single crystalline silicon material.

FIG. 8 is a diagram illustrating a variation of a bit line current according to a temperature variation when channels of memory cells are formed using a polycrystalline silicon material and a single crystalline silicon material. FIG. 9 is a diagram for describing a bit line voltage to cell current variation when channels of memory cells are formed using a polycrystalline silicon material and a single crystalline silicon material.

When a cell current flowing through a memory cell is constant (and/or substantially constant) regardless of a temperature variation, a stable sensing margin may be secured. A cell current capable of securing a stable sensing margin may be referred to as a target current IT (refer to FIG. 9). If a channel of a memory cell is formed of a single crystalline silicon material, as illustrated in FIGS. 8 and 9, a cell current may be saturated although a bit line voltage increases over a specific voltage for obtaining the target current IT. If a channel of a memory cell is formed of a polycrystalline silicon material, as illustrated in FIGS. 8 and 9, a cell current (or, a bit line current) may be increased in proportion to an increase in a bit line voltage. In other words, a cell current (or, a bit line current) flowing through a channel of a memory cell formed of a single crystalline silicon material may be saturated, while a cell current (or, a bit line current) flowing through a channel of a memory cell formed of a polycrystalline silicon material may be varied in proportion to a variation of a bit line voltage.

As illustrated in FIG. 9, a target current IT required at a high temperature (e.g., a default temperature) may be generated using a first bit line voltage V1. If a temperature is lowered, the amount of a cell current generated using the first bit line voltage V1 may be reduced. In case of example embodiments of inventive concepts, a cell current reduced due to lowering of a temperature may be compensated by increasing a bit line voltage (or, a bit line current). That is, when a bit line voltage is increased to a second bit line voltage V2 from the first bit line voltage V1, it is possible to supply the target current IT to a bit line BL. Although a bit line voltage is increased, as understood from FIG. 9, it is difficult to increase a cell current (or, a bit line current) flowing through a channel of a memory cell formed using a single crystalline silicon material.

Figure 10:
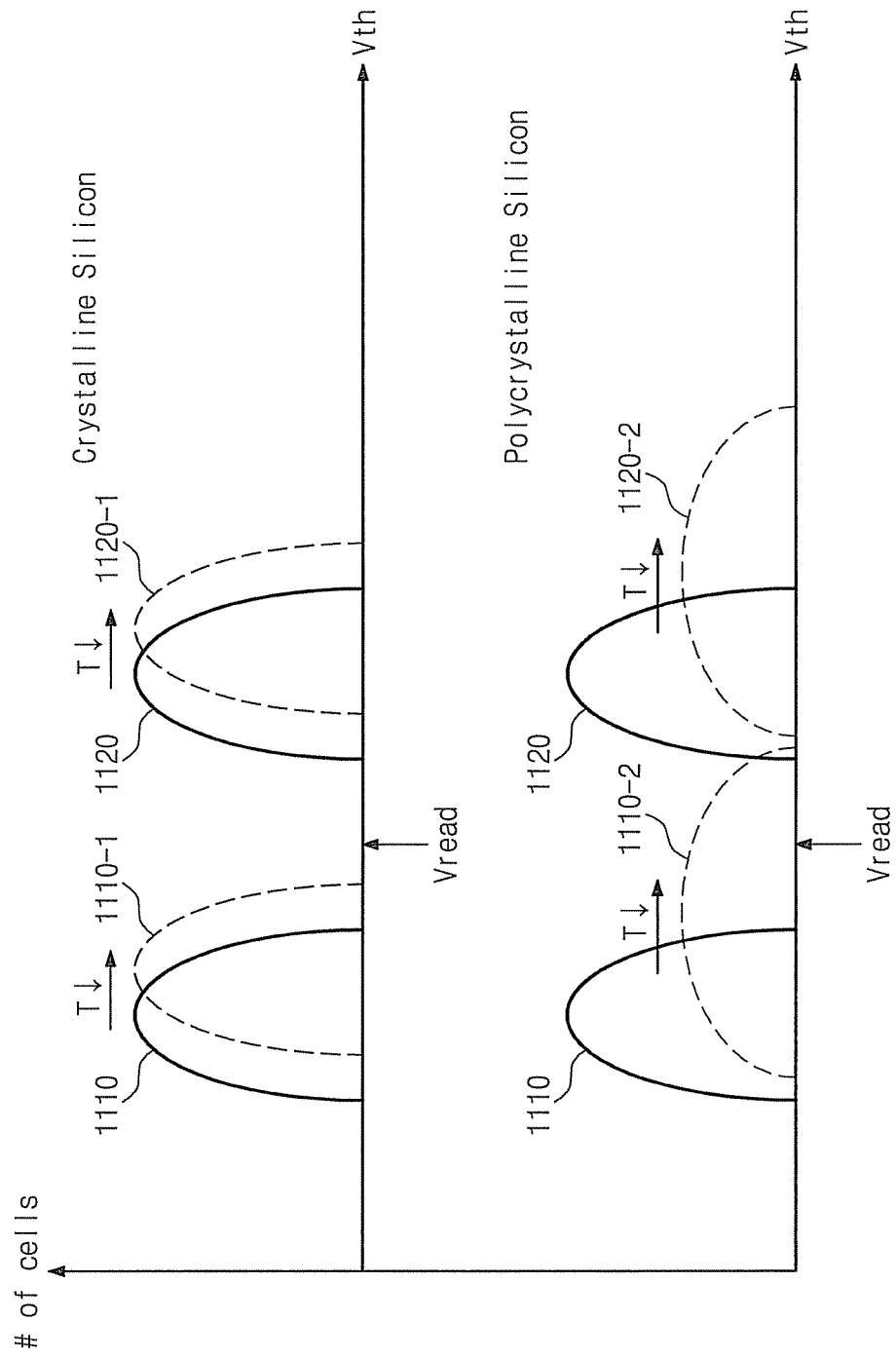
FIG. 10 is a diagram for describing a threshold voltage variation according to a temperature variation when channels of memory cells are formed using a polycrystalline silicon material and a single crystalline silicon material.

FIG. 10 is a diagram for describing a threshold voltage variation according to a temperature variation when channels of memory cells are formed using a polycrystalline silicon material and a single crystalline silicon material. Two threshold voltage distributions 1110 and 1120 are illustrated in FIG. 10. The number of threshold voltage distributions is determined according to the number of data bits being stored in a memory cell.

A curve 1110 may indicate a distribution of threshold voltages of memory cells each having a first state, and a curve 1120 may indicate a distribution of threshold voltages of memory cells each having a second state. Memory cells of the curve 1110 and memory cells of the curve 1120 may be discriminated using a read voltage Vread. Memory cells having channels formed of a polycrystalline silicon material and a single crystalline silicon material may be programmed to have threshold voltages within the curves 1110 and 1120. As a temperature is lowered, threshold voltages of memory cells may increase. This may mean that threshold voltage distributions corresponding to the curves 1110 and 1120 are shifted into threshold voltage distributions corresponding to the curves 1110-1 and 1120-1, respectively. This variation may arise when channels of memory cells are formed using a polycrystalline silicon material and a single crystalline silicon material.

As described in relation to FIGS. 8 and 9, when channels of memory cells are formed using a polycrystalline silicon material, a cell current may be reduced according to a decrease in a temperature. In this case, threshold voltage distributions 1110 and 1120 of memory cells each having a channel formed of a polycrystalline silicon material may be shifted into curves 1110-2 and 1120-2 instead of the curves 1110-1 and 1120-1. Threshold voltage distributions of memory cells within the curves 1110 and 1120 may be shifted into the curves 1110-2 and 1120-2 due to a decrease in a cell current as well as an increase in a threshold voltage. As compared with a threshold voltage variation caused when channels of memory cells are formed using a single crystalline silicon material, a threshold voltage variation caused when channels of memory cells are formed using a polycrystalline silicon material may become serious.

Since a cell current (or a bit line current) is reduced due to lowering of a temperature, a decrease in a sensing margin (or, a read margin) for detecting a voltage level of a bit line according to a current sensing technique may be affected by a decrease of a cell current in addition to an increase in a threshold voltage. For this reason, when channels of memory cells are formed using a polycrystalline silicon material, it is difficult to compensate a reduced cell current according to a technique where a gate voltage (or a word line voltage) supplied to a memory cell is controlled. Accordingly, when channels of memory cells are formed using a polycrystalline silicon material, a reduced cell current (or, a reduced sensing margin) may be compensated by adjusting a bit line voltage (or, a bit line current).

Figure 11:
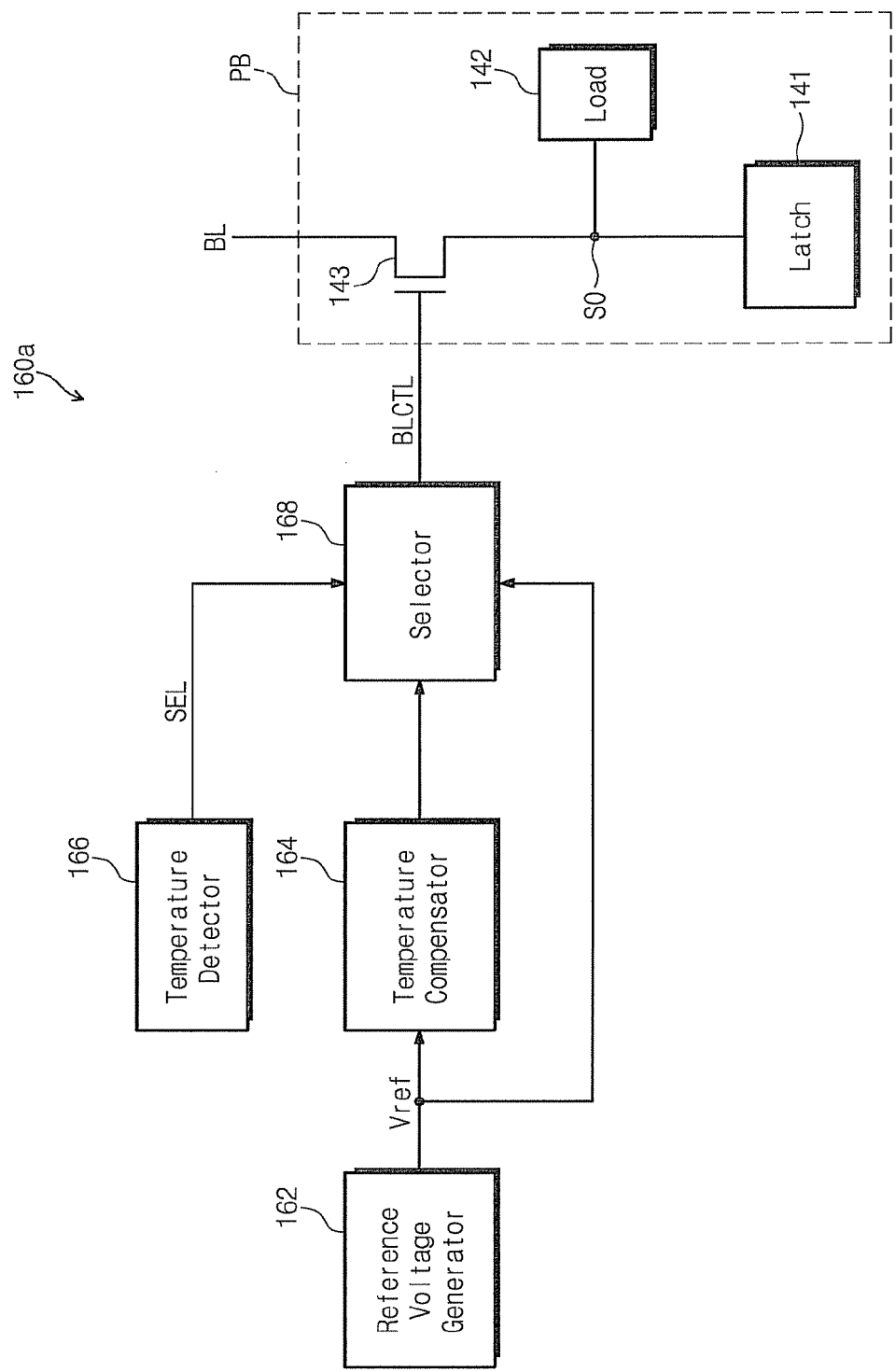
FIG. 11 is a block diagram illustrating a control signal generator circuit in FIG. 3 according to example embodiments of inventive concepts.

FIG. 11 is a block diagram illustrating a control signal generator circuit in FIG. 3 according to example embodiments of inventive concepts.

Referring to FIG. 11, a control signal generator circuit 160a may include a reference voltage generator 162, a temperature compensator 164, a temperature detector 166, and a selector 168. The constituent element 162 and 164 in FIG. 11 may be the same as (and/or substantially identical) to those in FIG. 5, and description thereof is thus omitted. The temperature detector 166 may be configured to generate a selection signal SEL indicating whether a current temperature of a nonvolatile memory device 1000 is lower than a reference temperature. When a current temperature of a nonvolatile memory device 1000 is higher than the reference temperature, the temperature detector 166 may inactivate the selection signal SEL. When a current temperature of a nonvolatile memory device 1000 is lower than the reference temperature, the temperature detector 166 may activate the selection signal SEL. The selector 168 may select one of an output voltage of the temperature compensator 164 and a reference voltage Vref in response to the selection signal SEL to output a control signal BLCTL having the selected voltage. When the selection signal SEL is activated, the control signal BLCTL may have the reference voltage Vref. When the selection signal SEL is activated, the control signal BLCTL may have an output voltage (i.e., a temperature-compensated voltage) of the temperature compensator 164. When the selection signal SEL is activated, a voltage of the control signal BLCTL may increase according to a decrease in a temperature. Accordingly, a bit line voltage (or, the amount of current provided to a bit line) may be controlled when a current temperature becomes lower than the reference temperature.

As understood from the above description, as a temperature is lowered, threshold voltages of memory cells having channels formed of a polycrystalline silicon material and a single crystalline silicon material may increase. This may mean that a threshold voltage distribution is shifted into an increasing direction. A read margin may be reduced due to a shift of a threshold voltage. In case of a semiconductor memory device which includes memory cells each having a channel formed of a single crystalline silicon material, a reduction of a read margin can be compensated by adjusting (compensating) a read voltage. At lowering of a temperature, a threshold voltage and a cell current of a memory cell having a channel formed of a single crystalline silicon material may increase. Since a read voltage and a cell current increase, the amount of current flowing through a channel may not be reduced. This may mean that a sensing margin (or, a read margin) determined according to a difference between a current flowing through a memory cell of an off state and a current flowing through a memory cell of an on state is not reduced. In other word, in case of a semiconductor memory device which includes memory cells each having a channel formed of a single crystalline silicon material, a current flowing through a memory cell of an on state may be kept to be constant and/or substantially constant regardless of a temperature variation.

However, a cell current of a memory cell having a channel formed of a polycrystalline silicon material may decrease as a temperature is lowered. Since a cell current is reduced as a temperature is lowered, the amount of current flowing through a channel may be lowered. This may mean that a sensing margin (or, a read margin) determined according to a difference between a current flowing through a memory cell of an off state and a current flowing through a memory cell of an on state is reduced. In other words, in semiconductor memory devices including memory cells each having a channel formed of a polycrystalline silicon material, although a read voltage is compensated, a current flowing through a memory cell of an on state may be reduced according to a temperature variation. That is, in case of a semiconductor memory device which includes memory cells each having a channel formed of a polycrystalline silicon material, it is difficult to compensate a sensing margin (or, a read margin) according to a temperature variation. For this reason, as described above, a sensing margin (or, a read margin) reduced according to a temperature variation may be compensated by increasing the amount of current supplied to a bit line (or, a bit line voltage) at a pre-charge/sensing interval. Further, it is possible to reduce and/or prevent a deterioration of a read disturbance by compensating a sensing margin (or, a read margin) without compensating a read voltage. For example embodiments of inventive concepts, it is possible to reduce read fail caused due to a reduction of a sensing margin (or, a read margin) when a temperature is lowered. Likewise, it is possible to reduce program fail and erase fail caused due to a reduction of a sensing margin (or, a read margin) when a temperature is lowered. In other words, it may be well understood that example embodiments of inventive concepts are applicable to verification read operations of program and erase operation as well as a read operation.

In example embodiments of inventive concepts, a technique of compensating a bit line voltage (or the amount of current supplied to a bit line) can be used with a read voltage compensating technique.

Figure 12:
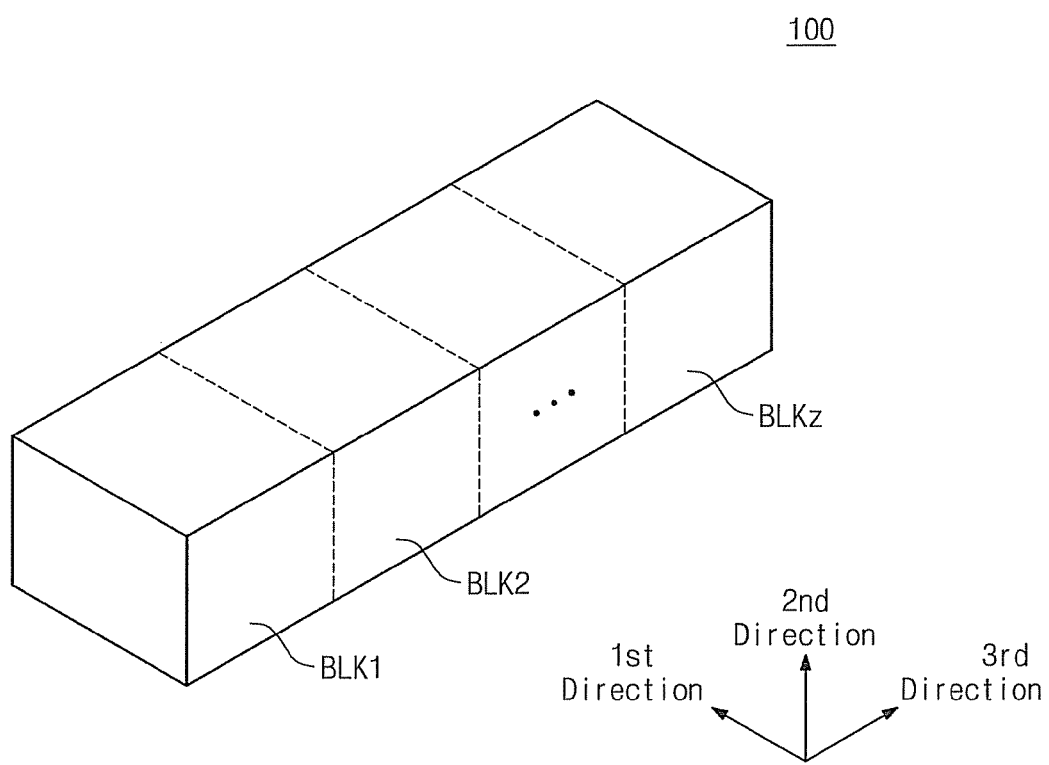
FIG. 12 is a diagram illustrating a memory cell array according to example embodiments of inventive concepts.

FIG. 12 is a diagram illustrating a memory cell array according to example embodiments of inventive concepts. A memory cell array according to example embodiments of inventive concepts may be configured to have a vertical structure. The vertical structure indicates such a structure that at least one string is formed to be vertical to a substrate.

Referring to FIG. 12, a memory cell array 110 may include a plurality of memory blocks BLK1 to BLKz, each of which has a three-dimensional structure (or, a vertical structure). For example, each of the memory blocks BLK1 to BLKz may include structures extending along the first to third directions. For example, each of the memory blocks BLK1 to BLKz may include a plurality of strings (or, NAND strings) extending along the second direction. As another example, a plurality of NAND strings may be provided along the first or third direction. According to example embodiments, the memory blocks BLK1 to BLKz may be selected by a row selector circuit 110 in FIG. 3.

Figure 13:
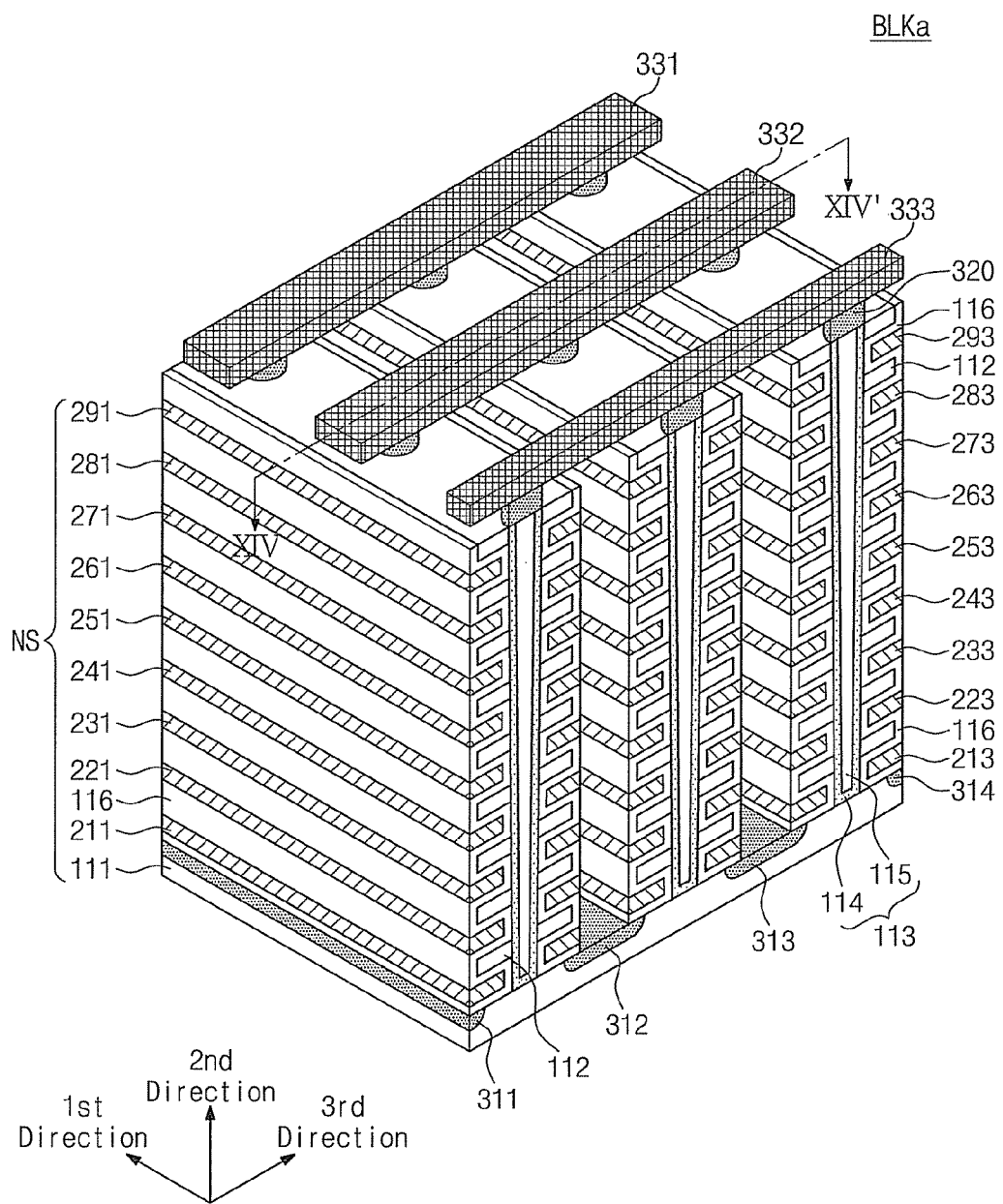
FIG. 13 is a perspective view of one of memory blocks in FIG. 12.
Figure 14:
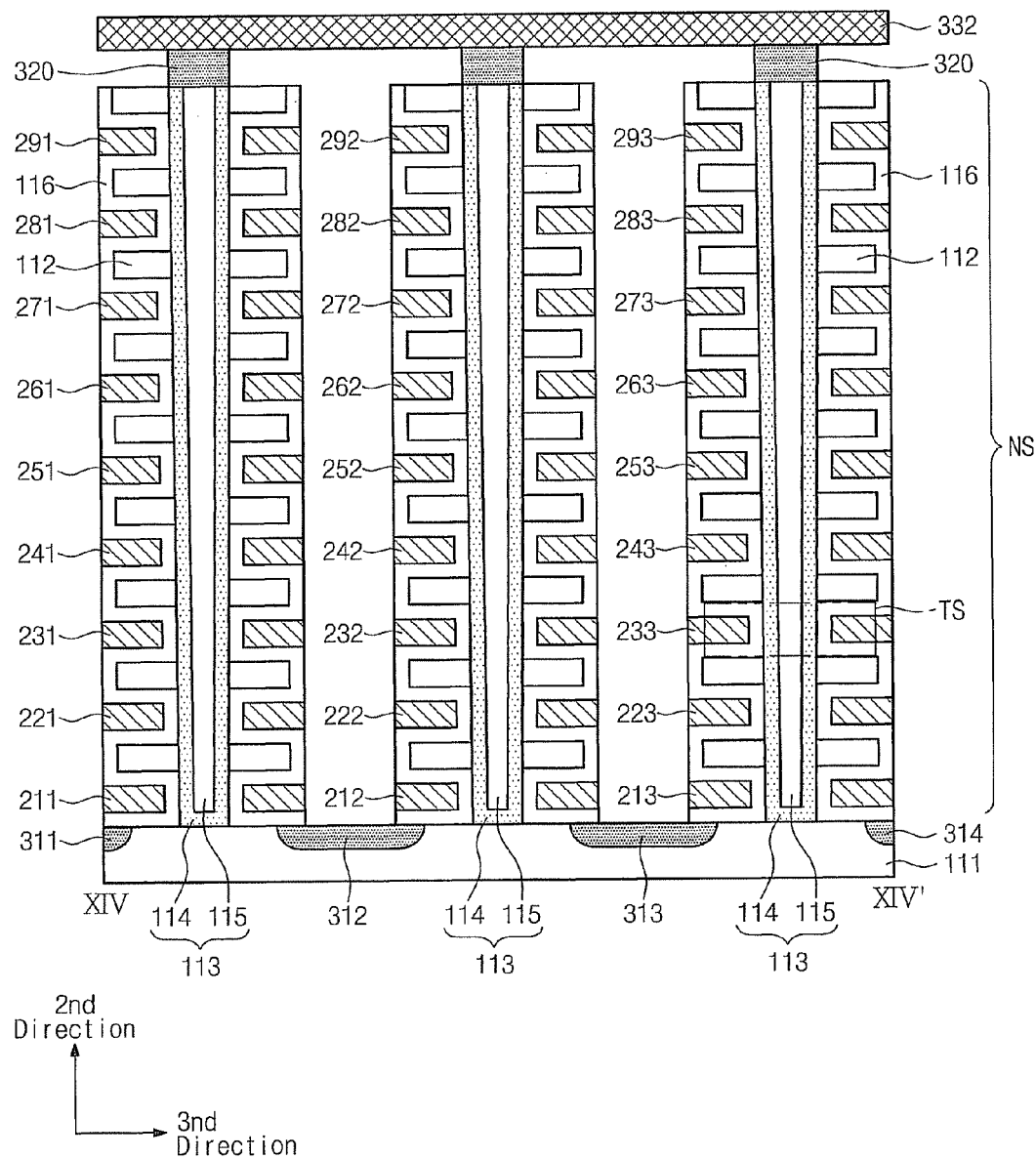
FIG. 14 is a cross-sectional view taken along a line XIV-XIV' of a memory block in FIG. 13.

FIG. 13 is a perspective view of one of memory blocks in FIG. 12, and FIG. 14 is a cross-sectional view taken along a line XIV-XIV' of a memory block in FIG. 13. Referring to FIGS. 13 and 14, a memory block BLKa may include structures extending along the first to third directions.

A substrate 111 is provided. The substrate 111 may be a well having the first conductivity type, for example. The substrate 111 may be a p-well in which the Group III element such as boron is injected, but example embodiments are not limited thereto. The substrate 111 may be a pocket p-well which is provided within an n-well. Below, it is assumed that the substrate 111 is a p-well (or, a pocket p-well). However, the substrate 111 is not limited to p-type. The substrate may be single crystalline silicon, but example embodiments are not limited thereto.

A plurality of doping regions 311 to 314 extending along the first direction may be provided in the substrate 111. The plurality of doping regions 311 to 314 may have a conductivity type different from that of the substrate 111. For ease of description, four doping regions 311 to 314 are illustrated in FIG. 5; however, example embodiments are not limited thereto and more doping regions may be provided along the third direction. The first to third doping regions 311 to 314 may have an n-type conductive material. Below, it is assumed that the first to third doping regions 311 to 314 are n-type. However, the first to third doping regions 311 to 314 are not limited to the n-type.

On the substrate 111 between the doping regions 311 and 312, a plurality of insulation materials 112 extending along the first direction may be provided sequentially along the second direction. For example, the plurality of insulation materials 112 may be formed to be spaced apart along the second direction. The insulation materials 112 may include an insulation material such as silicon oxide, but example embodiments are not limited thereto.

On the substrate 111 between the doping regions 311 and 312, a plurality of pillars 113 may be provided which is sequentially disposed along the first direction and passes through the insulation materials 112 along the second direction. For example, the pillars 113 may be connected to the substrate 111 through the insulation materials 112, respectively. Each pillar 113 may be formed of a plurality of materials. For example, a surface layer 114 of each pillar 113 may include a silicon material having the first conductive type. Alternatively, the surface layer 114 of each pillar 113 may include a silicon material which is doped by the same conductive type of the substrate 111. Hereinafter, it is assumed that the surface layer 114 of each pillar 113 includes p-type silicon. However, the surface layer 114 of each pillar 113 is not limited thereto. An inner layer 115 of each pillar 113 may be formed of an insulation material. For example, the inner layer 115 of each pillar 113 may include an insulation material such as silicon oxide, or alternatively, the inner layer 115 of each pillar 113 may include air gap, but example embodiments are not limited thereto.

Referring to each structure disposed between adjacent doping regions, an insulation layer 116 may be provided along the exposed surfaces of the substrate 111, the insulation materials 112 and the pillars 113. In example embodiments, an insulation film 116 provided on a second-direction exposed surface of the last insulation material 112 provided along the second direction can be removed. The insulation film 116 may be formed of one or more material layers. The first conductive materials 211 to 291 may be provided on exposed surfaces of the insulation films 116. For example, the first conductive material 211 extending along the first direction may be provided between the substrate 111 and an insulation film adjacent to the substrate 111. In example embodiments, the first conductive materials 211 to 291 may include a metallic material, or other conductive materials such as polysilicon, but example embodiments are not limited thereto. Conductive materials 212 to 292, and/or 213 to 293, may include the same materials, such as a metallic material or polysilicon, as the first conductive materials 211 to 291.

The same structure as disposed between the doping regions 311 and 312 may be provided between the doping regions 312 and 313. Likewise, the same structure as disposed between the doping regions 312 and 313 may be provided between the doping regions 313 and 314.

Plugs 320 may be provided on the pillars 113, respectively. For example, the plugs 320 may include a silicon material that is doped in a second conductive type. For example, the plugs 320 may include a silicon material that is doped in an n-type, but example embodiments are not limited thereto. Hereinafter, it is assumed that the plugs 320 include n-type silicon, but example embodiments are not limited thereto. The width of each of the plugs 320 may be wider than that of a corresponding pillar 113. For example, each plug 320 may be provided in a pad shape on the upper surface of a corresponding pillar 113. Conductive materials 331 to 333 extending in the third direction may be provided to be connected with the plugs 320.

The conductive materials 331 to 333 may be sequentially disposed along the first direction. The conductive materials 331 to 333 may include a conductive material such as a metal material or a polysilicon material such as a doped polysilicon material, but example embodiments are not limited thereto.

In FIG. 14, a structure disposed between adjacent doping regions (e.g., 311 and 312) may include pillars 113 which are electrically connected with conductive materials (e.g., 331, 332, and 333) acting as a bit line, respectively. The pillars 113 electrically connected with conductive materials (e.g., 331, 332, and 333) acting as a bit line may constitute a plane. This means that one memory block is formed of a plurality of planes.

In example embodiments, strings may be formed to be connected directly with the substrate or indirectly with the substrate.

Figure 15:
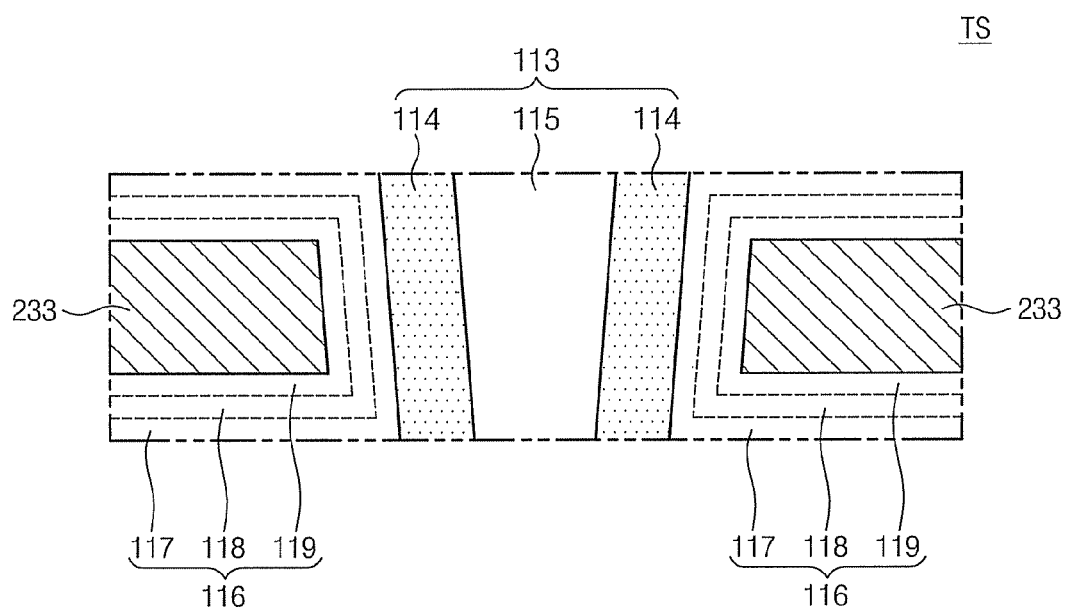
FIG. 15 is a cross section view of a transistor structure TS in FIG. 14.

FIG. 15 is a cross section view of a transistor structure TS in FIG. 14. Referring to FIGS. 13 to 15, an insulation film 116 may correspond to an insulation film 16 described with reference to FIG. 1, and may include the first to third sub insulation films 117, 118, and 119. A surface layer 114, including p-type silicon being a polycrystalline silicon material described in FIG. 1, of the pillar 113 may act as a body. The first sub-insulation layer 117 adjacent to the pillar 113 may act as a tunnel insulation film. For example, the first sub-insulation layer 117 adjacent to the pillar 113 includes an oxide layer, for example a thermal oxide layer. The second sub-insulation layer 118 may serve as a charge storage layer, but example embodiments are not limited thereto. For example, the second sub-insulation layer 118 may serve as a charge trap layer. For example, the second sub-insulation layer 118 may include a nitride layer or a metal oxide layer (e.g., an aluminum oxide layer or a hafnium oxide layer), but example embodiments are not limited thereto. The third sub-insulation layer 119 adjacent to the conductive material 233 may serve as a blocking insulation layer. For example, the third sub-insulation layer 119 adjacent to the conductive material 233 extending along the first direction may be formed as a single layer or a multi-layer. The third sub-insulation layer 119 may be a high dielectric layer (e.g., an aluminum oxide layer or a hafnium oxide layer, but example embodiments are not limited thereto) having a higher dielectric constant than the first and second sub-insulation layers 117 and 118.

The conductive material 233 may serve as a gate (or a control gate). That is, the conductive material 233 acting as a gate (or, control gate), the third sub-insulation film 119 acting as a blocking insulation layer, the second sub-insulation film 118 acting as a charge storage layer, the first sub-insulation film 117 acting as a tunneling insulation layer, and the surface layer 114, including p-type silicon, acting as a body may constitute a transistor (or, a memory cell transistor structure). For example, the first to third sub-insulation layers 117 to 119 may form oxide-nitride-oxide (ONO), but example embodiments are not limited thereto. Below, the surface layer 114, including the p-type silicon, of the pillar 113 may be referred to as the second-direction body.

A memory block BLKa may include a plurality of pillars 113. That is, the memory block BLKa may include a plurality of NAND strings. In more detail, the memory block BLKa may include a plurality of NAND strings extending along the second direction (or a direction vertical to the substrate). Each NAND string NS may include a plurality of transistor structures TS disposed along the second direction. At least one of the transistor structures TS in each NAND string may serve as a string selection transistor SST. At least one of the remaining transistor structures TS in each NAND string may serve as a ground selection transistor GST.

Gates (or control gates) may correspond to conductive materials 211 to 291, 212 to 292, and 213 to 293 extending along the first direction. That is, the gates (or the control gates) may be extended in the first direction to form word lines and at least two selection lines (e.g., at least one string selection line SSL and at least one ground selection line GSL). The conductive materials 331 to 333 extending along the third direction may be connected to one ends of the NAND strings, respectively. For example, the conductive materials 331 to 333 extending along the third direction may serve as bit lines BL. That is, in one memory block BLKa, a plurality of NAND strings may be connected to one bit line BL. Doping regions 311 to 314 extending in the first direction may be provided to other ends of the NAND strings, respectively. The doping regions 311 to 314 extending along the first direction may serve as a common source line CSL.

To sum up the above-described, the memory block BLKa may include a plurality of NAND strings extending along a direction (i.e., the second direction) vertical to the substrate 111, and may serve as a NAND flash memory block (e.g., a charge trapping type) where the plurality of NAND strings is connected to one bit line BL.

Figure 16:
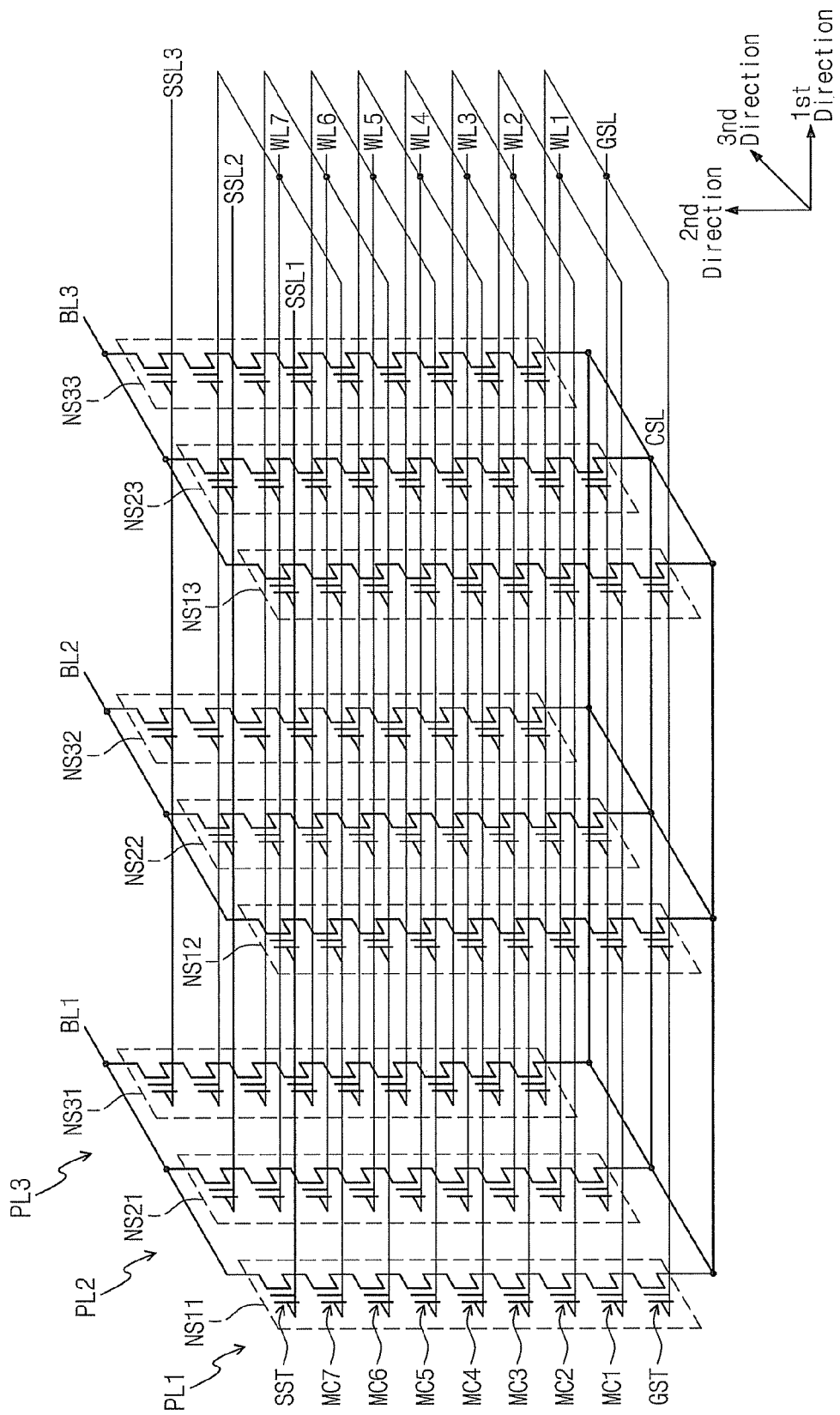
FIG. 16 is a circuit diagram illustrating an equivalent circuit of a memory block in FIG. 13 according to example embodiments of inventive concepts.

FIG. 16 is a circuit diagram illustrating an equivalent circuit of a memory block in FIG. 13 according to example embodiments of inventive concepts.

Referring to FIG. 16, NAND strings may be provided between a bit line BL1 and a common source line CSL. For example, NAND strings NS11, NS21, and NS31 may be provided between the bit line BL1 and the common source line CSL, NAND strings NS12, NS22, and NS32 may be provided between a bit line BL2 and the common source line CSL, and NAND strings NS13, NS23, and NS33 may be provided between a bit line BL3 and the common source line CSL. The bit lines BL1 to BL3 may correspond to conductive materials 331 to 333 (refer to FIG. 13) extending along the third direction.

A string selection transistor SST of each NAND string may be connected with a corresponding bit line. A ground selection transistor GST of each NAND string may be connected with the common source line CSL. Memory cells MC may be provided between the string and ground selection transistors SST and GST in each NAND string.

NAND strings connected in common with one bit line may form one column. For example, NAND strings NS11 to NS31 connected with the bit line BL1 may form the first column. NAND strings NS12 to NS32 connected with the bit line BL2 may form the second column. NAND strings NS13 to NS33 connected with the bit line BL3 may form the third column. NAND strings connected with one string selection line SSL may form a row. For example, NAND strings NS11 to NS13 connected with a string selection line SSL1 may form the first row. NAND strings NS21 to NS23 connected with a string selection line SSL2 may form the second row. NAND strings NS31 to NS33 connected with a string selection line SSL3 may form the third row.

As illustrated in FIG. 16, NAND strings arranged in rows and columns may be configured to share a ground selection line GSL. Memory cells in each row (or, each plane) may share word lines WL1 to WL7 arranged at other layers. For example, memory cells MC1 in a plane PL1 and adjacent to the ground selection transistors GST may share the word line WL1, and memory cells MC7 in the plane PL1 and adjacent to the string selection transistors SST may share the word line WL7.

NAND strings in the same row/plane may share a string selection line. For example, NAND strings NS11, NS12, and NS13 in the plane PL1 may share a string selection line SSL1, NAND strings NS21, NS22, and NS23 in the plane PL2 may share a string selection line SSL2, and NAND strings NS31, NS32, and NS33 in the plane PL3 may share a string selection line SSL3. The string selection lines SSL1, SSL2, and SSL3 may be controlled independently, so that NAND strings (e.g., NS11, NS12, and NS13) in any plane/row (e.g., PL1) are electrically connected with bit lines BL1, LB2, and BL3, respectively. NAND strings (e.g., NS21, NS22, NS23, NS31, NS32, and NS33) in the remaining planes/rows (e.g., PL2 and PL3) are electrically separated from the bit lines BL1, LB2, and BL3.

In an example embodiments, at program and read operations, one of the string selection lines SSL1 to SSL3 may be selected by a row decoder circuit 120 (refer to FIG. 1). That is, the program and read operations may be executed by the row/plane unit of NAND strings NS11~NS13, NS21~NS23, and NS31~NS33.

FIGS. 17 to 20 are circuit diagrams illustrating equivalent circuits of a memory block in FIG. 13 according to example embodiments of inventive concepts.

Figure 17:
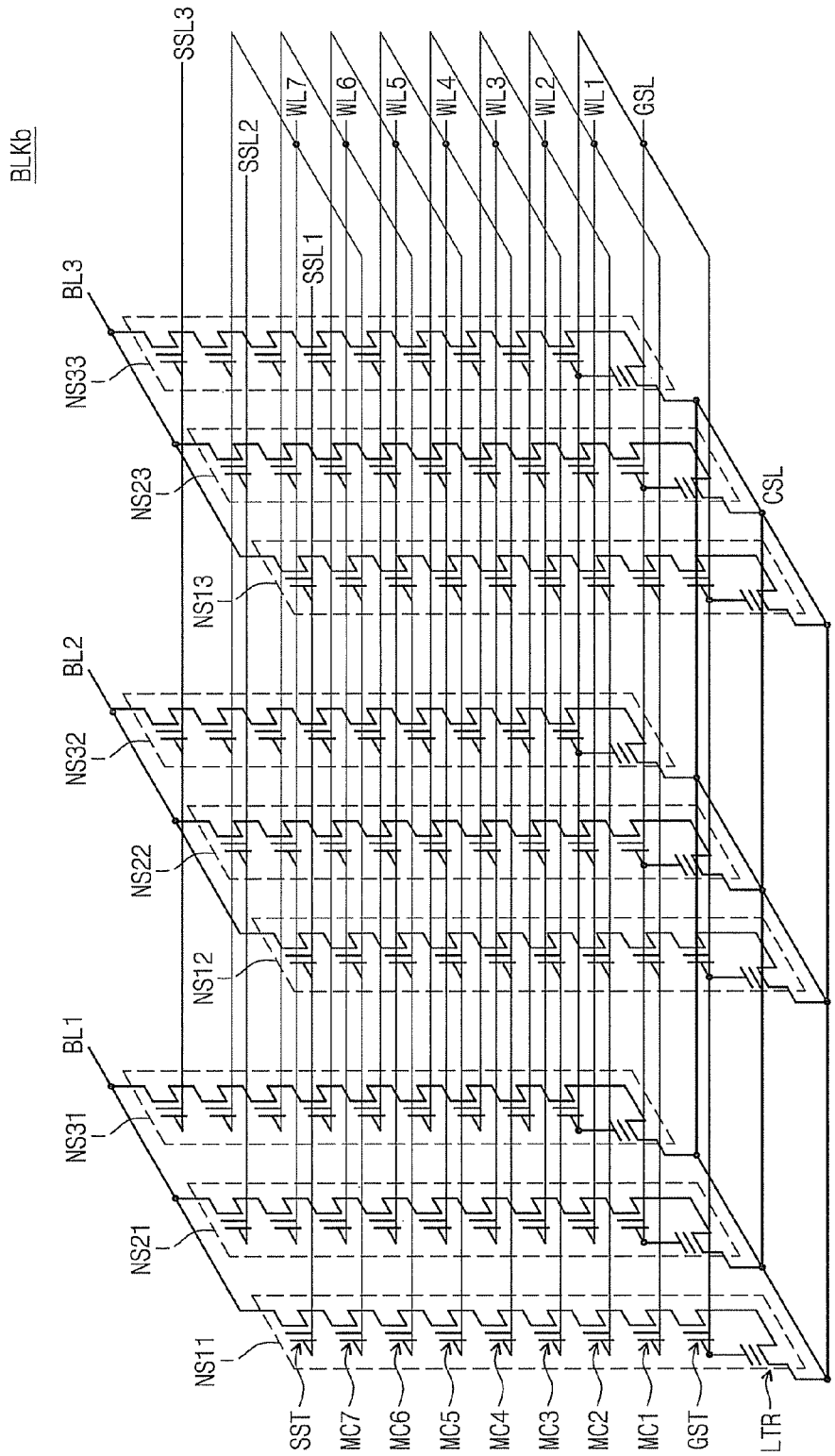
FIGS. 17 to 20 are circuit diagrams illustrating equivalent circuits of a memory block in FIG. 13 according to example embodiments of inventive concepts.

Referring to FIG. 17, a lateral transistor LTR may be further provided to each NAND string of a memory block BLKb. In each NAND string, the lateral transistor LTR may be connected between a ground selection transistor GST and a common source line CSL. A gate (or, a control gate) of the lateral transistor LTR may be connected to a ground selection line GSL with a gate (or, a control gate) of the ground selection transistor GST. The memory block BLKb in FIG. 17 may be substantially identical to that in FIG. 16, and description thereof is thus omitted.

Figure 18:
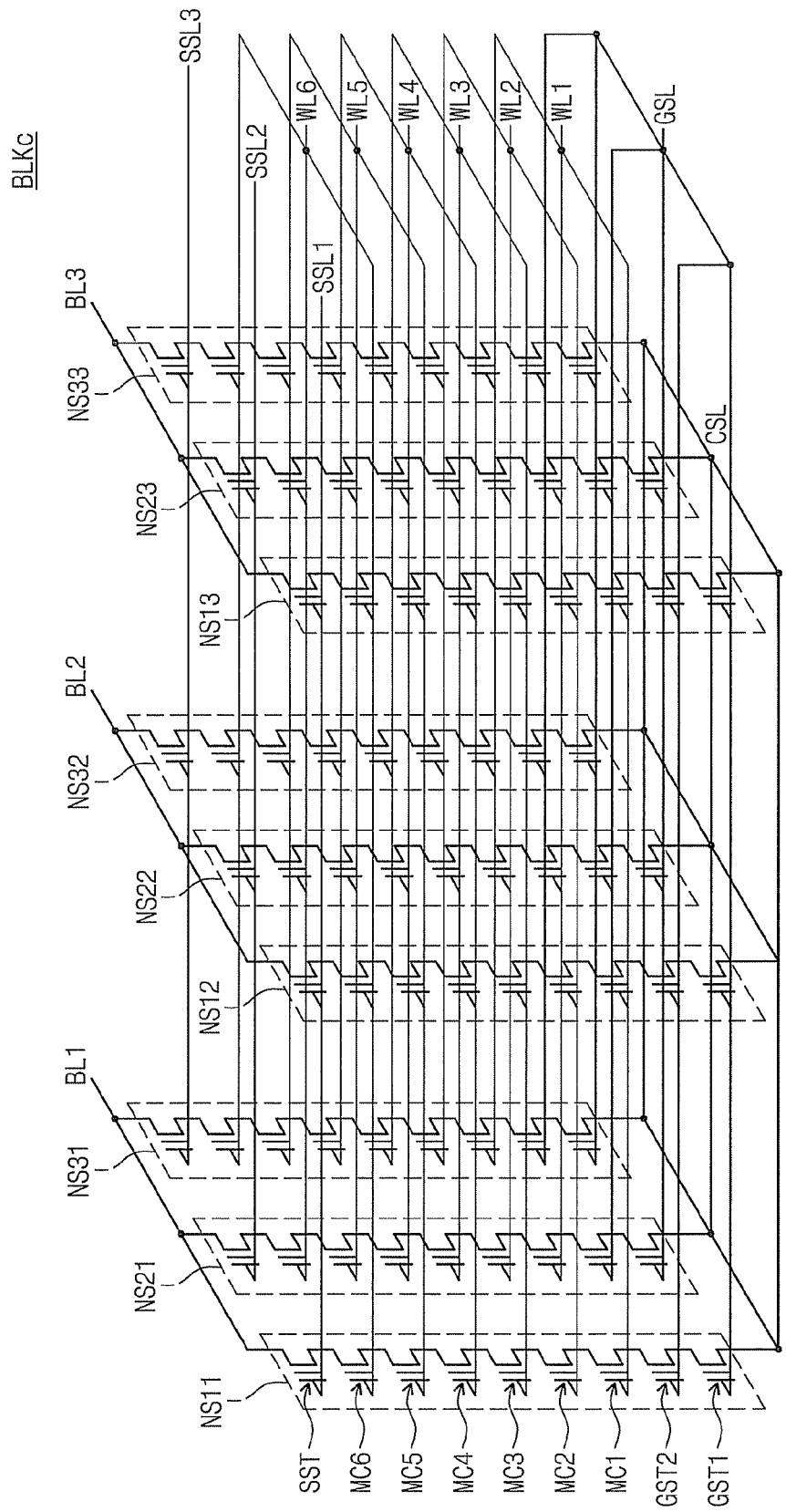

As illustrated in FIG. 18, each NAND string may include two ground selection transistors GST1 and GST2 connected between memory cells MC1 to MC6 and the common source line CSL. The ground selection transistors GST1 and GST2 may be connected with one ground selection line GSL. The memory block BLKc in FIG. 18 may be substantially identical to that in FIG. 16 except for the above-described difference.

Figure 19:
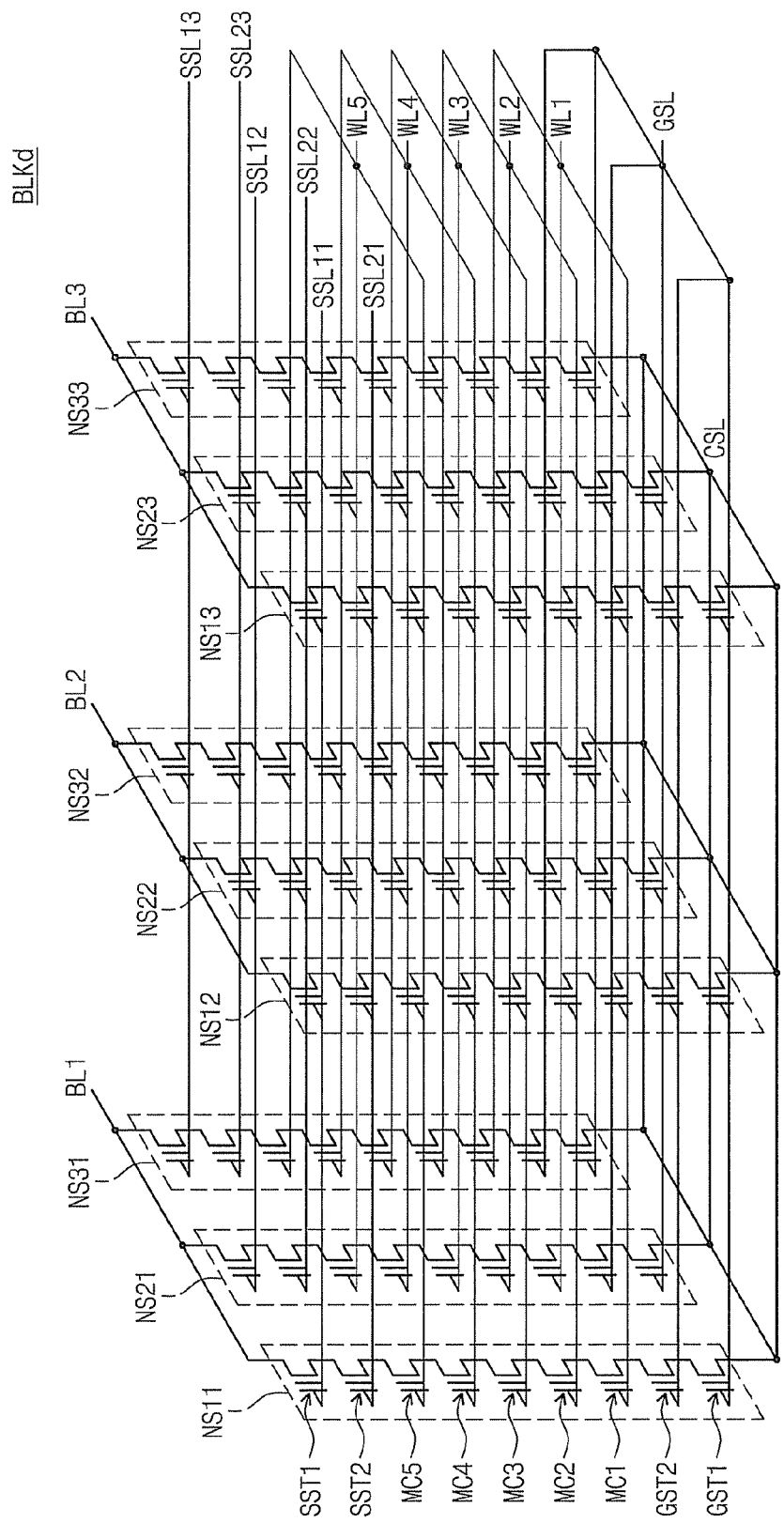
Figure 20:
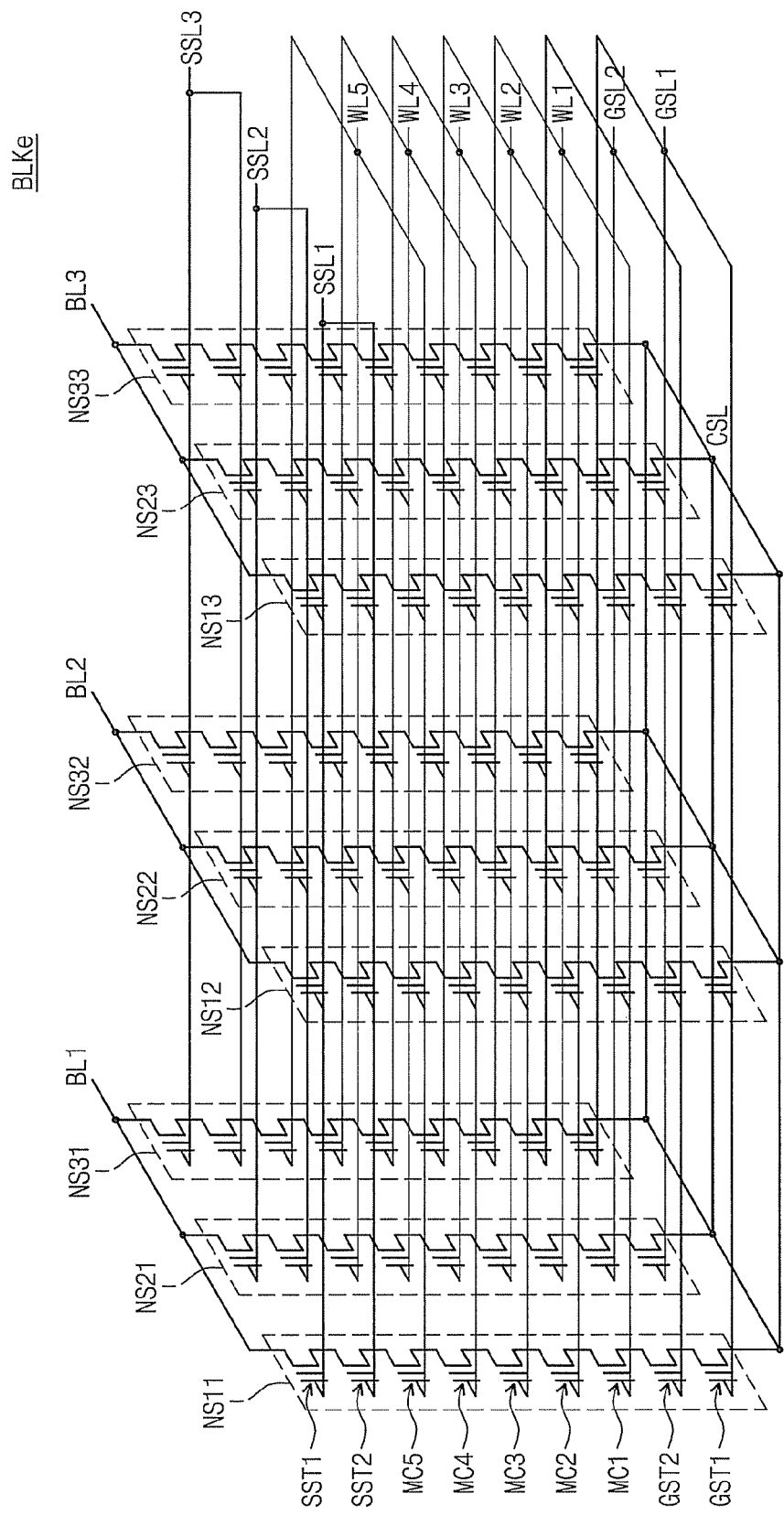

As compared with the memory block BLKc in FIG. 18, a memory block BLKd in FIG. 19 may include two string selection transistors SST1 and SST2 disposed between the memory cells MC1 to MC5 and a bit line BL. The string selection transistors SST1 and SST2 in each NAND string may be controlled independently by corresponding string selection lines SSL1 and SSL2. The memory block BLKd in FIG. 19 may be substantially identical to that in FIG. 18 except for the above-described difference, and description thereof is thus omitted. Unlike the memory block BLKd illustrated in FIG. 19, a memory block BLKe in FIG. 20 may be configured such that string selection transistors SST1 and SST2 in each NAND string are controlled by string selection lines SSL1 and SSL2 which are connected electrically. The memory block BLKe in FIG. 20 may be substantially identical to that in FIG. 19 except for the above-described difference, and description thereof is thus omitted.

Figure 21:
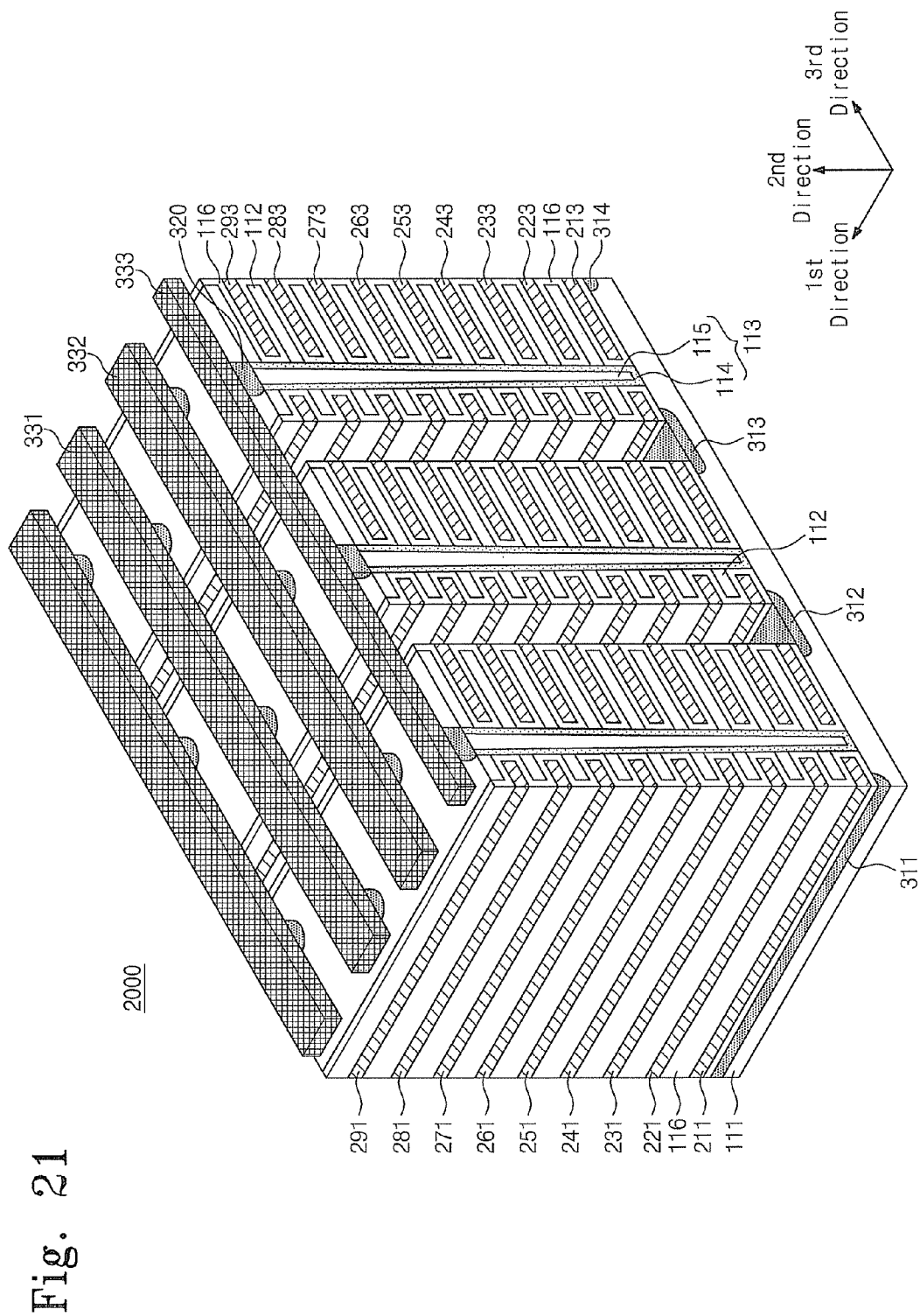
FIG. 21 is a perspective view illustrating a part of one of memory blocks in FIG. 12 according to example embodiments of inventive concepts.

FIG. 21 is a perspective view illustrating a part of one of memory blocks in FIG. 12 according to example embodiments of inventive concepts. In FIG. 21, constituent elements which have the same function as those in FIG. 13 may be represented by the same reference numerals, and description thereof is thus omitted. A memory block 2000 in FIG. 21 may be substantially identical to that in FIG. 13 except that strings (or, pillars) in a structure (or, plane) placed between adjacent doping regions (e.g., 311 and 312) are arranged in two lines.

Figure 22:
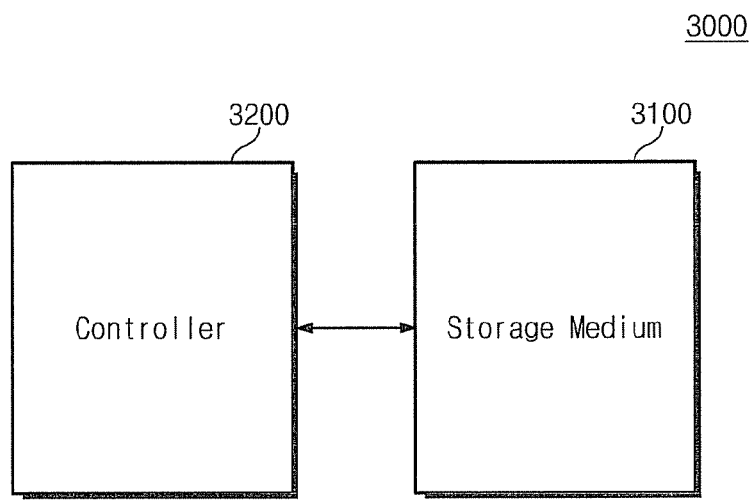
FIG. 22 is a block diagram illustrating a data storage device including a nonvolatile memory device according to example embodiments of inventive concepts.

FIG. 22 is a block diagram illustrating a data storage device including a nonvolatile memory device according to example embodiments of inventive concepts.

Referring to FIG. 22, a data storage device 3000 may include a storage medium 3100 and a controller 3200. The storage medium 3100 may be used to store data information having various data formats such as a text, a graphic, a software code, and the like, but example embodiments are not limited thereto. The storage medium 3100 may be formed of a nonvolatile memory device 1000 which includes memory cells each having a channel formed of a polycrystalline silicon material. As described above, in case of the nonvolatile memory device 1000, a sensing margin (or, a read margin) reduced due to a temperature variation may be compensated by increasing the amount of current (or a bit line voltage) supplied to a bit line at a pre-charge/sensing period. Further, deterioration of a read disturbance may be reduced by compensating a sensing margin (or, a read margin) without compensating a read voltage. According to example embodiments, it is possible to reduce read fail caused due to a decrease in a sensing margin (or, a read margin) when a temperature decreases. Likewise, it is possible to reduce program fail and erase fail caused due to a decrease in a sensing margin (or, a read margin) when a temperature decreases. The controller 3200 may be configured to control the storage medium in response to an external request.

Figure 23:
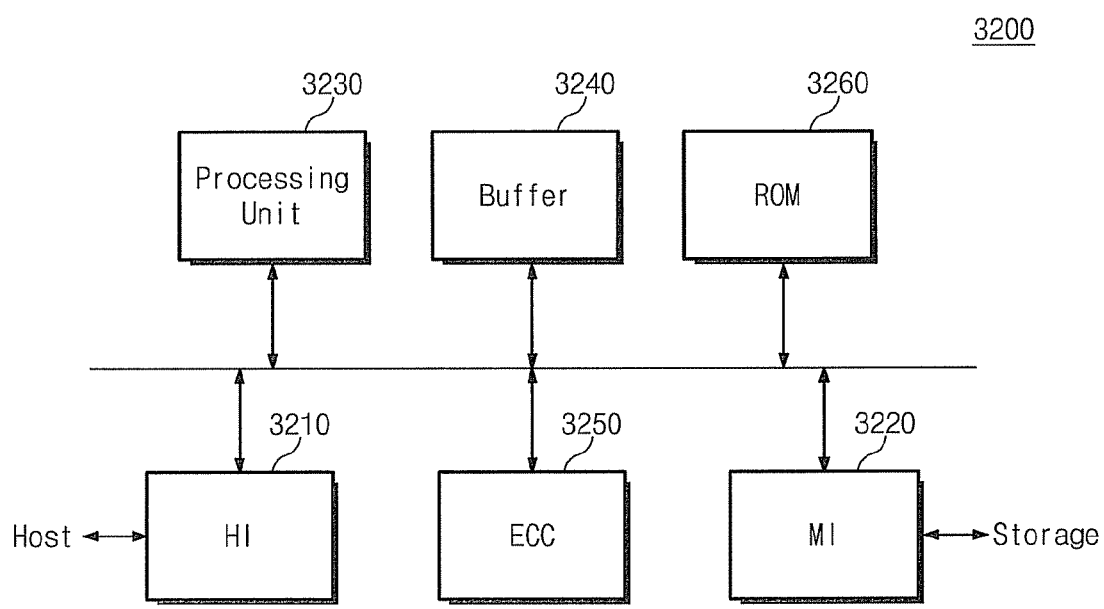
FIG. 23 is a block diagram showing a controller according to example embodiments of inventive concepts.

FIG. 23 is a block diagram showing a controller according to example embodiments of inventive concepts. Referring to FIG. 23, a controller 3200 according to an example embodiments of inventive concepts may include the first interface (or, host interface) 3210, the second interface (or, memory interface) 3220, a processing unit 3230, a buffer 3240, an ECC unit 3250, and ROM 3260.

The first interface 3210 may be configured to interface with an external device (or, a host). The second interface 3220 may be configured to interface with a storage medium 3100 illustrated in FIG. 12. For example, the processing unit 3230 may be configured to control an overall operation of the controller 3200. For example, the processing unit 3230 may be configured to operate firmware such as a Flash Translation Layer (FTL) stored in the ROM 3260. The buffer 3240 may be used to temporarily store data transferred from the external device via the first interface 3210. The buffer 3240 may be used to temporarily store data transferred from the storage medium 3100 via the second interface 3220. The ECC unit 3250 may be configured to encode data to be stored in the storage medium 3100 and to decode data read out from the storage medium 3100.

The first interface 3210 may include computer buses, storage bus standards, iFCP Peripheral bus standards, or a combination of two or more thereof. The computer bus standards may include S-100 bus, Mbus, Smbus, Q-Bus, ISA, Zorro II, Zorro III, CAMAC, FASTBUS, LPC, EISA, VME, VXI, NuBus, TURBO channel, MCA, Sbus, VLB, PCI, PXI, HP GSC bus, CoreConnect, InfiniBand, UPA, PCI-X, AGP, PCIe, Intel QuickPath Interconnect, Hyper Transport, etc., but example embodiments are not limited thereto. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc., but example embodiments are not limited thereto. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc., but example embodiments are not limited thereto.

Figure 24:
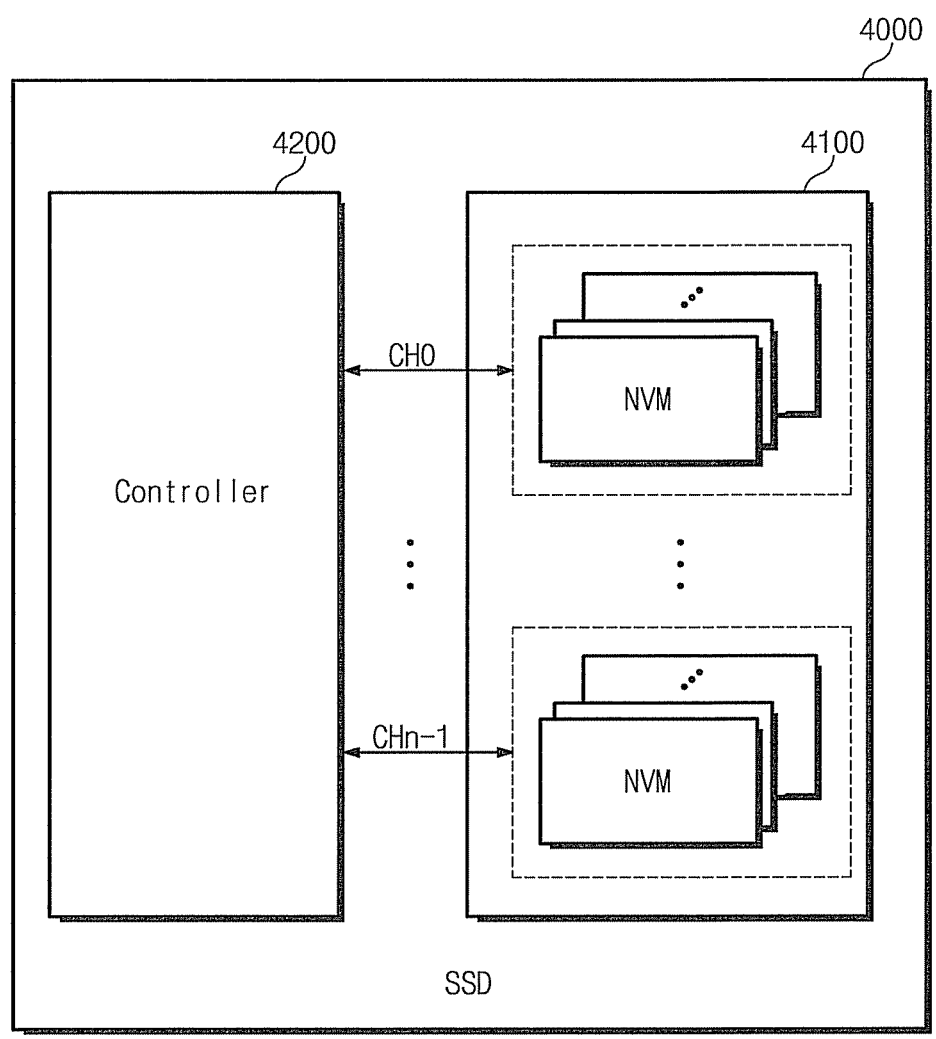
FIG. 24 is a block diagram showing a solid state drive using a nonvolatile memory device according to example embodiments of inventive concepts.

FIG. 24 is a block diagram showing a solid state drive using a nonvolatile memory device according to example embodiments of inventive concepts.

Referring to FIG. 24, a solid state drive (SSD) 4000 may comprise a storage medium 4100 and a controller 4200. The storage medium 4100 may be connected with the controller 4200 via a plurality of channels (e.g., CH0 CHn−1), each of which is connected in common with a plurality of nonvolatile memories, each of which is formed of a nonvolatile memory device 1000 which includes memory cells each having a channel formed of a polycrystalline silicon material. As described above, in case of the nonvolatile memory device 1000, a sensing margin (or, a read margin) reduced due to a temperature variation may be compensated by increasing the amount of current (or a bit line voltage) supplied to a bit line at a pre-charge/sensing period. Further, deterioration of a read disturbance may be reduced by compensating a sensing margin (or, a read margin) without compensating a read voltage. According to example embodiments, it is possible to reduce read fail caused due to a decrease in a sensing margin (or, a read margin) when a temperature decreases. Likewise, it is possible to reduce program fail and erase fail caused due to a decrease in a sensing margin (or, a read margin) when a temperature decreases.

Figure 25:
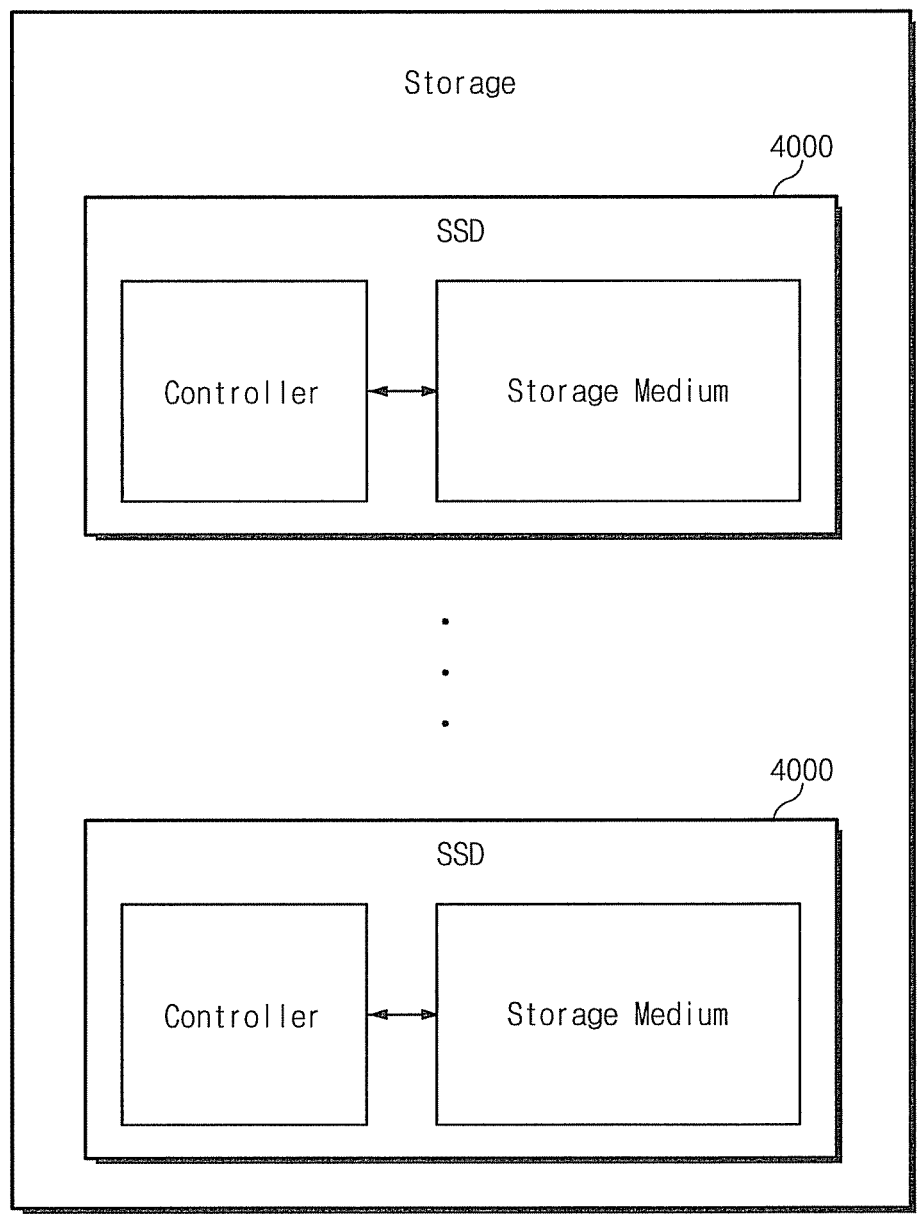
FIG. 25 is a block diagram showing a storage using a solid state drive in FIG. 24.
Figure 26:
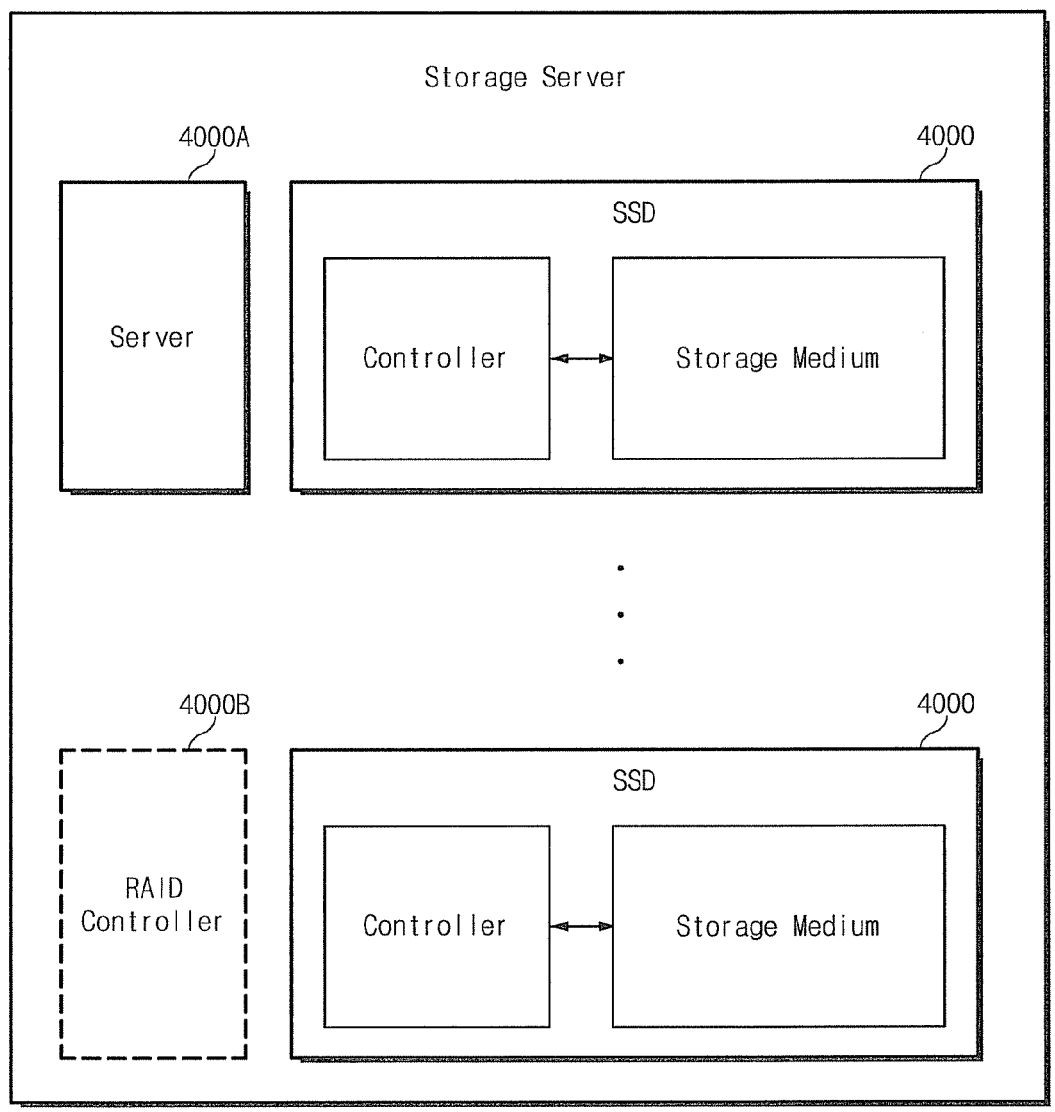
FIG. 26 is a block diagram showing a storage server using a solid state drive in FIG. 24.

FIG. 25 is a block diagram showing a storage using a solid state drive in FIG. 24, and FIG. 26 is a block diagram showing a storage server using a solid state drive in FIG. 24.

An SSD 4000 according to example embodiments of inventive concepts may be used to form the storage. As illustrated in FIG. 25, the storage may include a plurality of solid state drives 4000 which are configured the same as described in FIG. 24. An SSD 4000 according to example embodiments of inventive concepts may be used to configure a storage sever. As illustrated in FIG. 26, a storage server includes a plurality of solid state drives 4000, which are configured the same as described in FIG. 24, and a server 4000A. Further, it is well comprehended that a well-known RAID controller 4000B is provided within the storage server.

Figure 27:
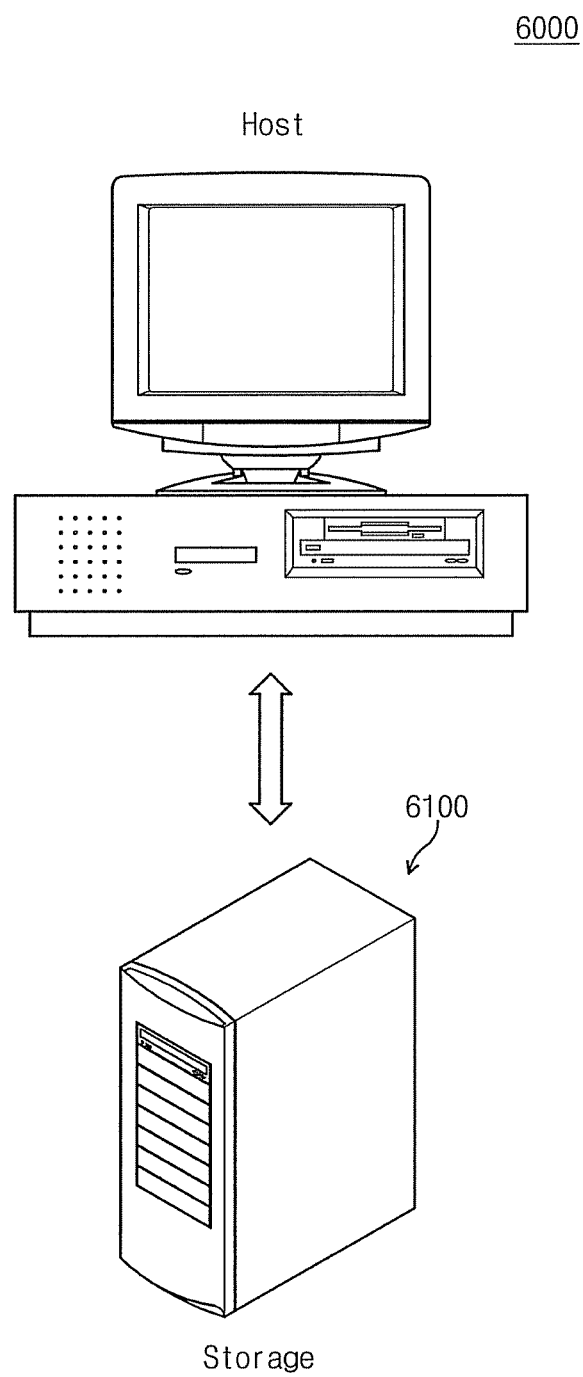
FIGS. 27 to 29 are diagrams showing systems to which a data storage device according to example embodiments of inventive concepts is applied.
Figure 28:
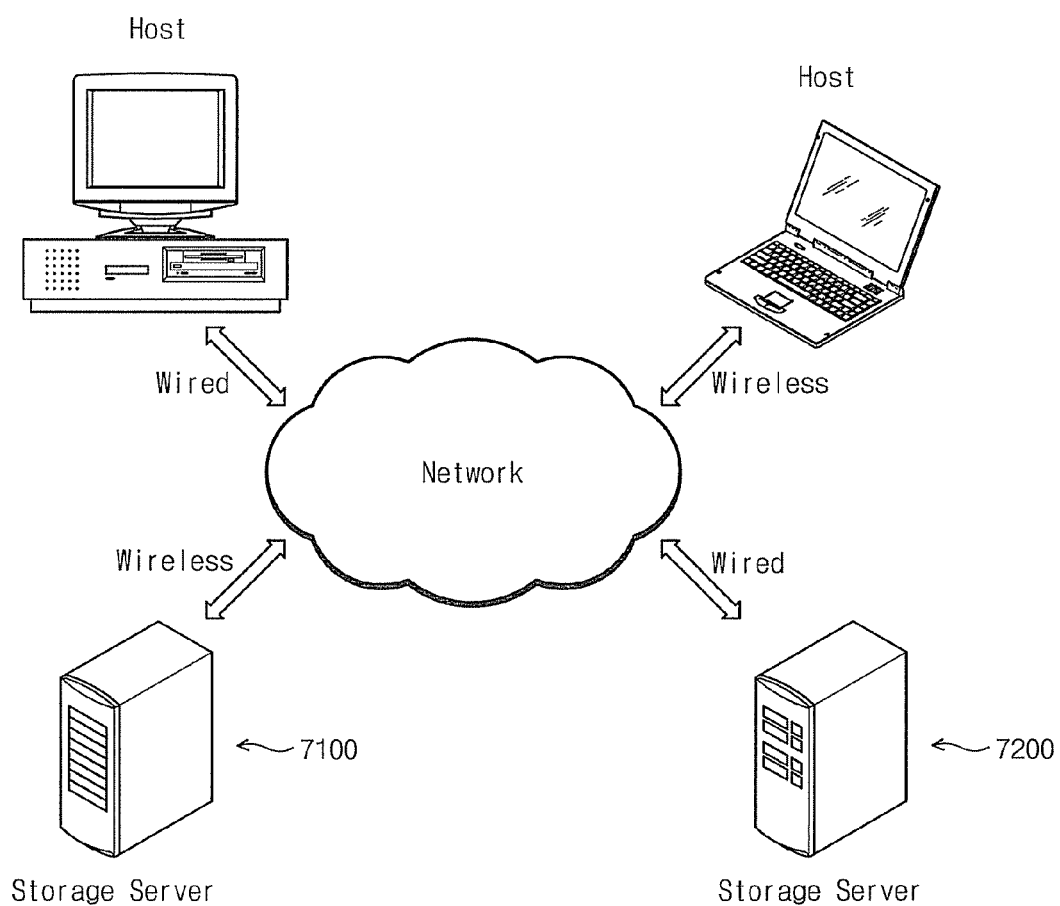
Figure 29:
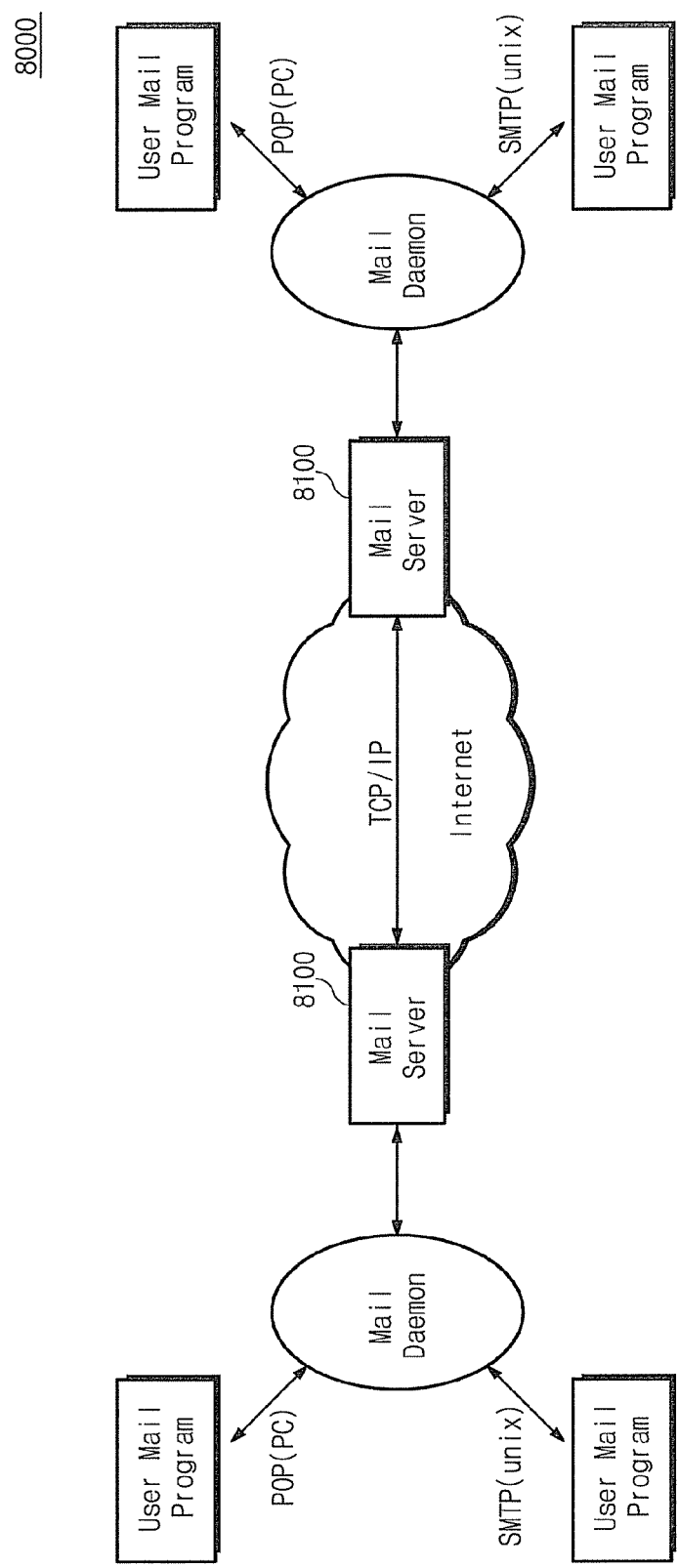

FIGS. 27 to 29 are diagrams showing systems to which a data storage device according to example embodiments of inventive concepts is applied.

In the event that a solid state drive including a data storage device according to example embodiments of inventive concepts is applied to the storage, as illustrated in FIG. 27, a system 6000 may include a storage 6100 which communicates with a host by a wire or wireless manner. In a case where a solid state drive including a data storage device according to example embodiments of inventive concepts is applied to a storage server, as illustrated in FIG. 28, a system 7000 may include a storage servers 7100 and 7200 which communicate with a host by a wire or wireless manner. Further, as illustrated in FIG. 29, a solid state drive including a data storage device according to example embodiments of inventive concepts can be applied to a mail server 8100. The mail server 8100 may communicate with user mail programs via a mail daemon connected in POP and SMTP manners, but example embodiments are not limited thereto. Mail servers 8100 may communicate via an interne network.

FIGS. 30 to 34 are diagrams showing other systems to which a data storage device according to example embodiments of inventive concepts is applied.

Figure 30:
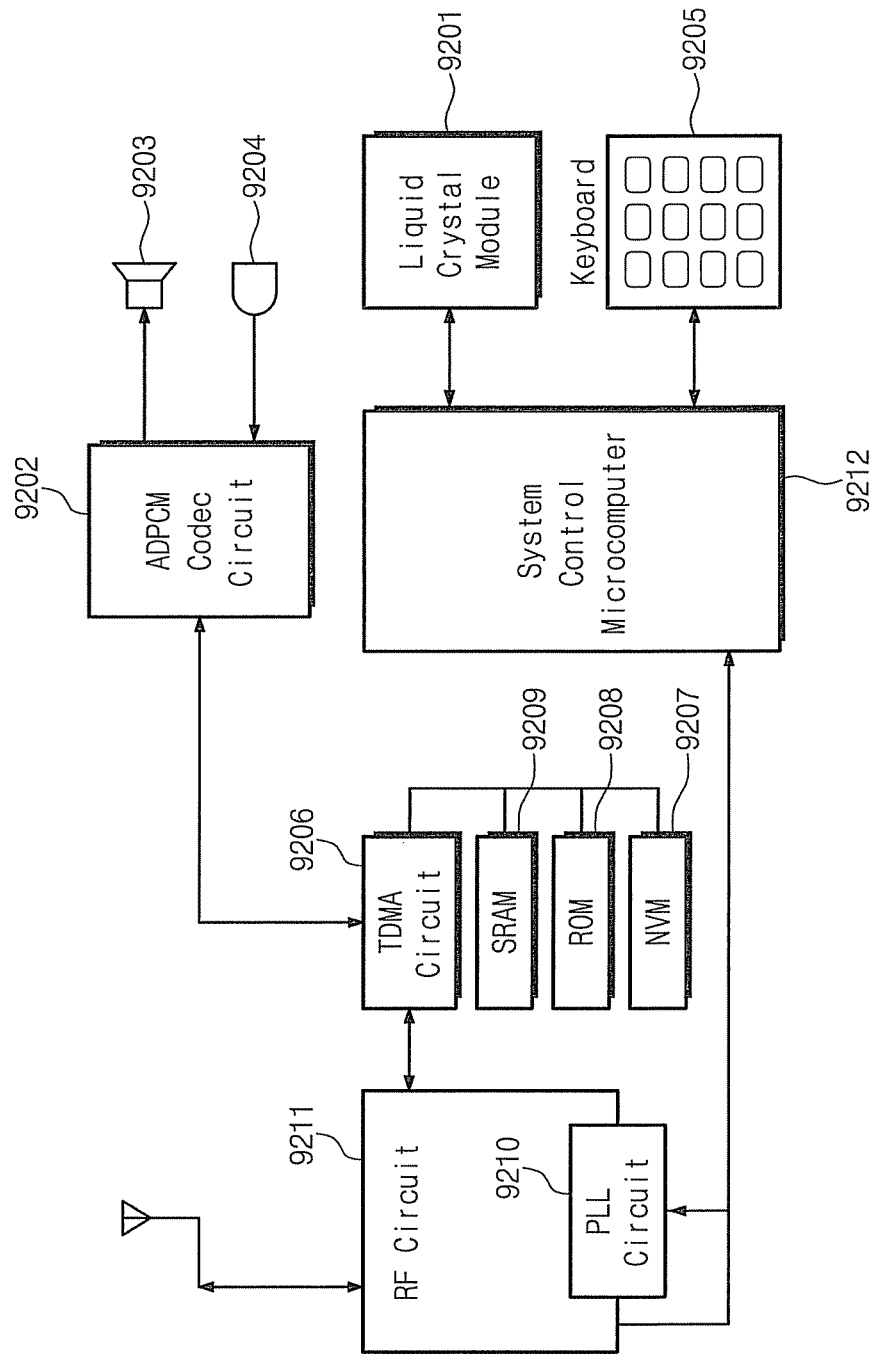
FIGS. 30 to 34 are diagrams showing other systems to which a data storage device according to example embodiments of inventive concepts is applied.

FIG. 30 is a block diagram illustrating a cellular phone system according to example embodiments of inventive concepts.

Referring to FIG. 30, a cellular phone system may include an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as at least one nonvolatile memory device 9207, ROM 9208, and/or SRAM 9209. The nonvolatile memory device 9207 may be formed of a nonvolatile memory device 1000 which includes memory cells each having a channel formed of a polycrystalline silicon material according to example embodiments. As described above, in case of the nonvolatile memory device 1000, a sensing margin (or, a read margin) reduced due to a temperature variation may be compensated by increasing the amount of current (or a bit line voltage) supplied to a bit line at a pre-charge/sensing period. Further, deterioration of a read disturbance may be reduced and/or prevented by compensating a sensing margin (or, a read margin) without compensating a read voltage. According to example embodiments, it is possible to reduce read fail caused due to a decrease in a sensing margin (or, a read margin) when a temperature decreases. Likewise, it is possible to reduce program fail and erase fail caused due to a decrease in a sensing margin (or, a read margin) when a temperature decreases. The ROM 9208 may be used to store programs, and the SRAM 9209 may be used as a work region for the system control microcomputer 9212 or/and to temporarily store data, but example embodiments are not limited thereto. Herein, the system control microcomputer 9212 may be a processor which is configured to control write and read operations of the nonvolatile memory device 9207.

Figure 31:
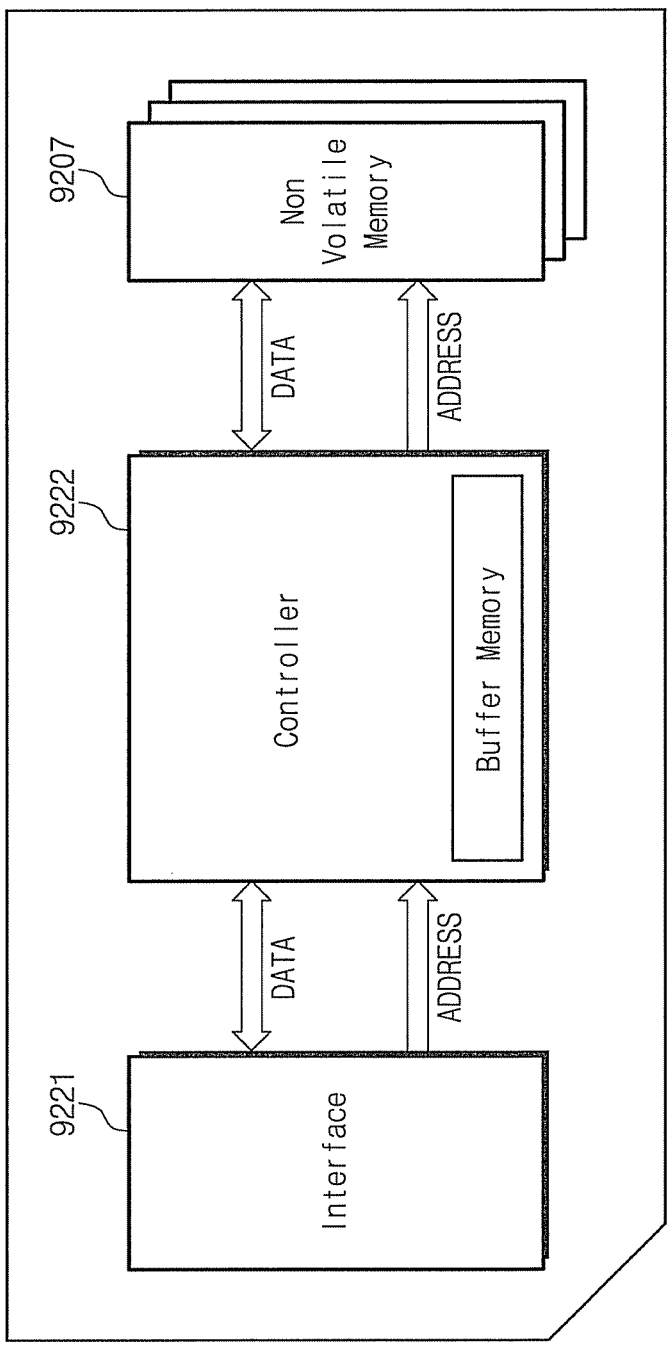

FIG. 31 is a block diagram illustrating a memory card according to example embodiments of inventive concepts. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 31, the memory card may include an interface circuit 9221 for interfacing with an external device, a controller 9222 including a buffer memory and controlling an operation of the memory card, and at least one nonvolatile memory device 9207 according to example embodiments of inventive concepts. The nonvolatile memory device 9207 may be formed of a nonvolatile memory device 1000 which includes memory cells each having a channel formed of a polycrystalline silicon material according to example embodiments. As described above, in case of the nonvolatile memory device 1000, a sensing margin (or, a read margin) reduced due to a temperature variation may be compensated by increasing the amount of current (or a bit line voltage) supplied to a bit line at a pre-charge/sensing period. Further, deterioration of a read disturbance may be reduced and/or prevented by compensating a sensing margin (or, a read margin) without compensating a read voltage. In case of example embodiments, it is possible to reduce read fail caused due to a decrease in a sensing margin (or, a read margin) when a temperature decreases. Likewise, it is possible to reduce program fail and erase fail caused due to a decrease in a sensing margin (or, a read margin) when a temperature decreases. The controller 9222 may be a processor which is configured to control write and read operations of the nonvolatile memory device 9207. In particular, the controller 9222 may be coupled with the nonvolatile memory device 9207 and the interface circuit 2221 via a data bus and an address bus.

Figure 32:
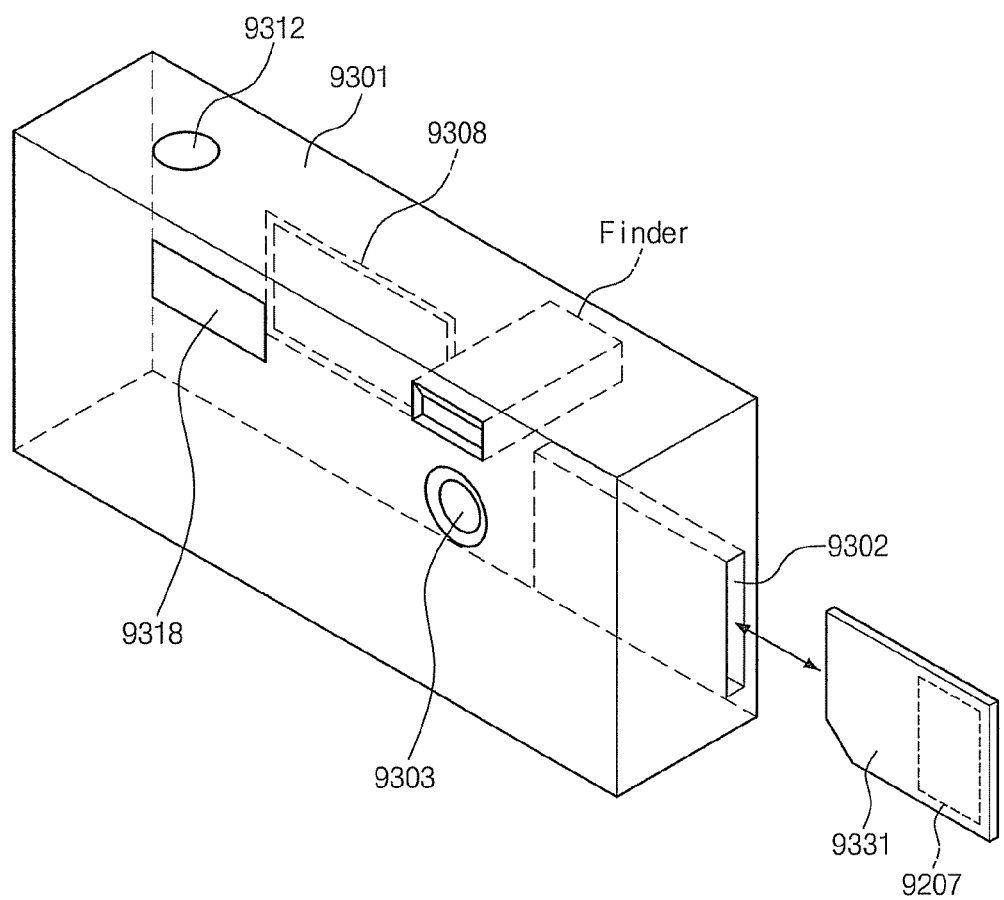

FIG. 32 is a block diagram illustrating a digital still camera according to example embodiments of inventive concepts.

Referring to FIG. 32, a digital still camera may include a body 9301, a slot 9302, a lens 9303, a display circuit 9308, a shutter button 9312, a strobe 9318, Finder, and the like. In particular, a memory card 9331 may be inserted in the slot 9302 and includes at least one nonvolatile memory device 9207 according to example embodiments of inventive concepts. The nonvolatile memory device 9207 may be formed of a nonvolatile memory device 1000 which includes memory cells each having a channel formed of a polycrystalline silicon material according to example embodiments. As described above, in case of the nonvolatile memory device 1000, a sensing margin (or, a read margin) reduced due to a temperature variation may be compensated by increasing the amount of current (or a bit line voltage) supplied to a bit line at a pre-charge/sensing period. Further, deterioration of a read disturbance may be prevented by compensating a sensing margin (or, a read margin) without compensating a read voltage. According to example embodiments, it is possible to reduce read fail caused due to a decrease in a sensing margin (or, a read margin) when a temperature decreases. Likewise, it is possible to reduce program fail and erase fail caused due to a decrease in a sensing margin (or, a read margin) when a temperature decreases. If the memory card 9331 has a contact type, an electric circuit on a circuit board may be electrically contacted with the memory card 9331 when it is inserted in the slot 9308. In the event that the memory card 9331 has a non-contact type, an electric circuit on a circuit board may communicate with the memory card 9331 in a radio-frequency manner.

Figure 33:
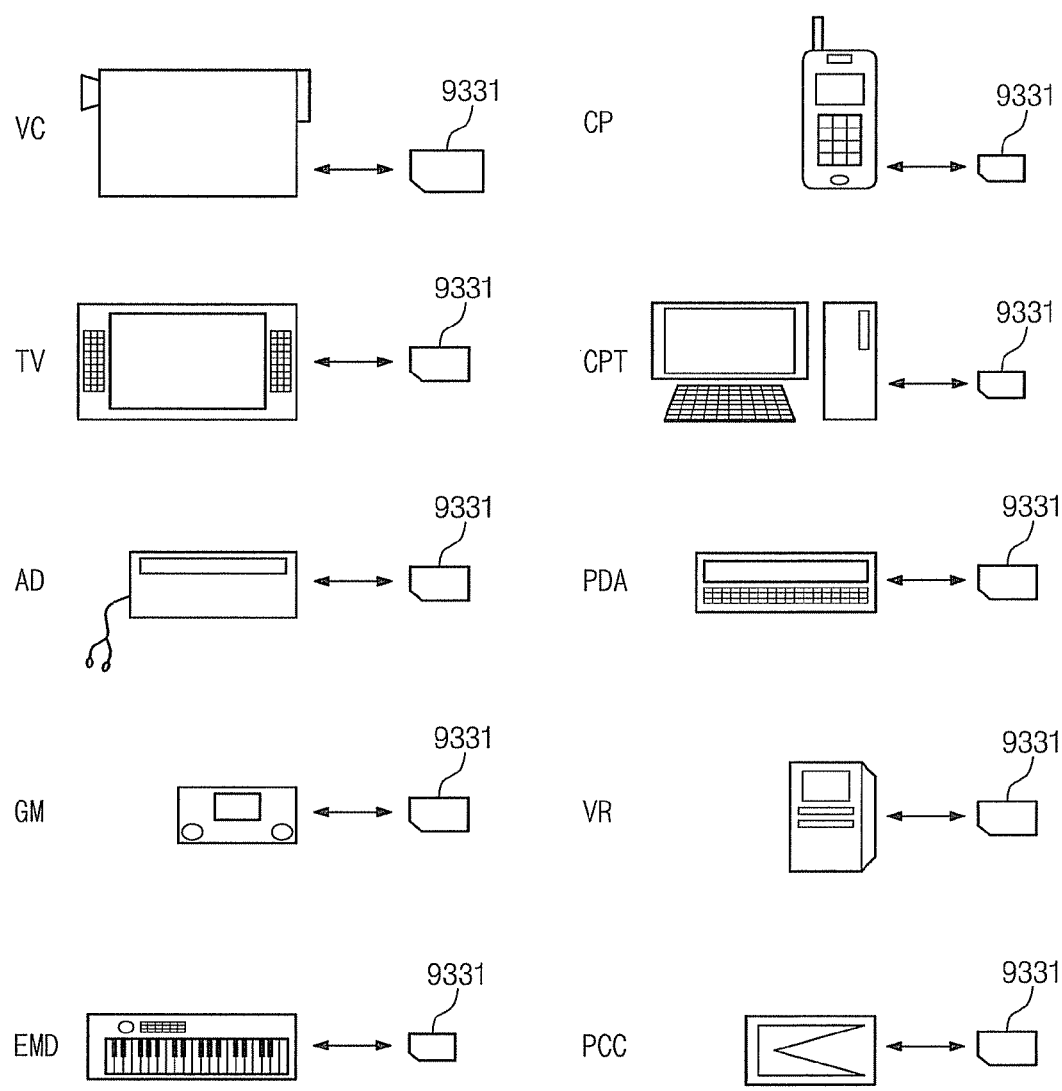

FIG. 33 is a diagram illustrating various systems to which a memory card in FIG. 32 is applied.

Referring to FIG. 33, a memory card 9331 may be applied to a video camera VC, a television TV, an audio device AD, a game machine GM, an electronic music device EMD, a cellular phone CP, a computer CPT, a personal digital assistant PDA, a voice recorder VR, a PC card PCC, and the like.

Figure 34:
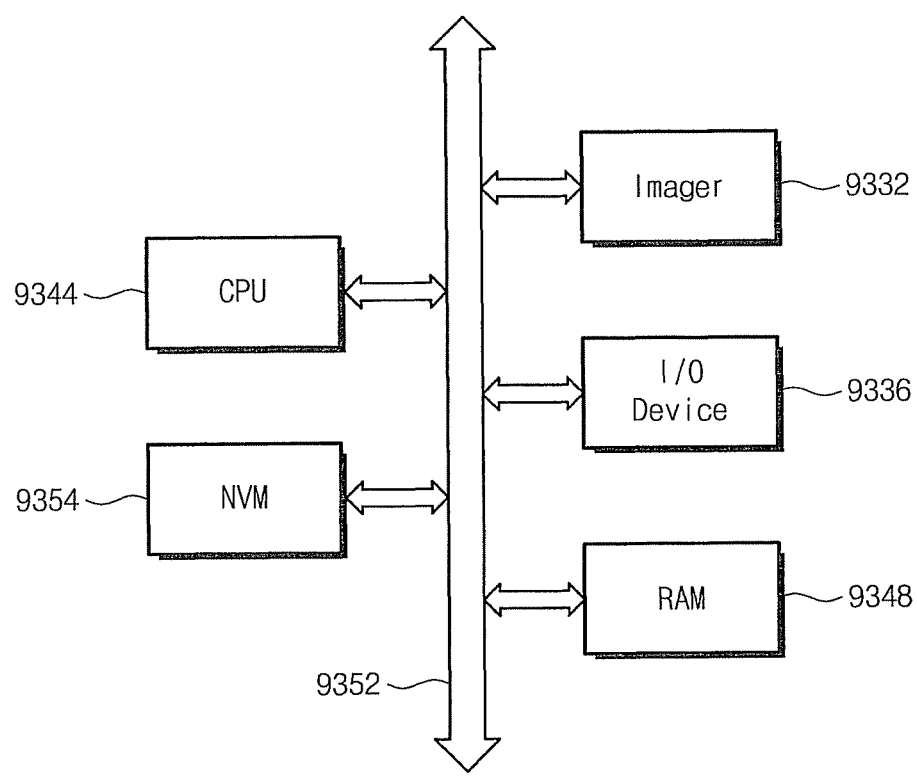

FIG. 34 is a block diagram illustrating an image sensor system according to example embodiments of inventive concepts.

Referring to FIG. 34, an image sensor system may include an image sensor 9332, an input/output device 9336, RAM 9348, CPU 9344, and a nonvolatile memory device 9354 according to example embodiments of inventive concepts. The nonvolatile memory device 9354 may be formed of a nonvolatile memory device 1000 which includes memory cells each having a channel formed of a polycrystalline silicon material according to example embodiments. As described above, in case of the nonvolatile memory device 1000, a sensing margin (or, a read margin) reduced due to a temperature variation may be compensated by increasing the amount of current (or a bit line voltage) supplied to a bit line at a pre-charge/sensing period. Further, deterioration of a read disturbance may be prevented by compensating a sensing margin (or, a read margin) without compensating a read voltage. According to example embodiments, it is possible to reduce read fail caused due to a decrease in a sensing margin (or, a read margin) when a temperature decreases. Likewise, it is possible to reduce program fail and erase fail caused due to a decrease in a sensing margin (or, a read margin) when a temperature decreases. Elements in FIG. 34, that is, the image sensor 9332, the input/output device 9336, the RAM 9348, the nonvolatile memory device 9354 may communicate with one another via a bus 9352. The image sensor 9332 may include a photo sensing device such as a photo-gate, photo-diode, or the like. Elements in FIG. 34 may be formed of a single chip together with a processor or independently from the processor.

A nonvolatile memory device and/or a controller may be packed by various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other variations which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
a substrate;
at least one string extending vertically from the substrate, the at least one string including,
   a channel containing a polycrystalline silicon material,
   a plurality of gate structures on the channel, the plurality of gate structures forming memory transistors with the channel; and
a bit line current controlling circuit connected to the at least one string via at least one bit line,
the bit line current controlling circuit being configured to increase an amount of current supplied to the at least one bit line according to a decrease in a temperature such that a current flowing through a channel of the at least one string is increased when the temperature decreases.

2. The nonvolatile memory device of claim 1, wherein the device is configured to increase a current flowing through at least one of the memory transistors when the amount of current being supplied to the at least one bit line increases.

3. The nonvolatile memory device of claim 2, wherein the bit line current controlling circuit is configured to control the amount of current being supplied to the at least one bit line during an operation where a state of a selected one of the memory transistors is judged.

4. The nonvolatile memory device of claim 3, wherein the operation includes one of at least one of read operation, a program verification operation, and an erase verification operation.

5. The nonvolatile memory device of claim 1, wherein a voltage being applied to the plurality of gate structures is not adjusted according to a decrease in a temperature.

6. The nonvolatile memory device of claim 5, wherein the bit line current controlling circuit comprises:
a latch unit connected with a sensing node;
an NMOS transistor connected between one of the at least one bit lines and the sensing node and configured to operate in response to a control signal;
a load unit configured to supply a current to the sensing node; and
a control signal generator configured to generate the control signal,
the control signal generator configured to control a voltage of the control signal so as to increase the amount of current flowing through the NMOS transistor when the temperature decreases.

7. The nonvolatile memory device of claim 6, wherein the control signal generator is configured to control the voltage of the control signal when a temperature of the nonvolatile memory device is lower than a reference temperature.

8. A nonvolatile memory device comprising:
a substrate;
strings extending vertically from the substrate, each string including a channel containing a polycrystalline silicon material and a plurality of gate structures on the channel;
page buffers connected with bit lines corresponding to the strings, respectively; and
a page buffer controlling circuit configured to control the page buffers so as to adjust the amount of current being supplied to each bit line according to a temperature variation.

9. The nonvolatile memory device of claim 8, wherein the page buffer controlling circuit is configured to control the page buffers so as to increase the amount of current being supplied to each bit line according to a decrease in a temperature and a current flowing through the channel of each string is increased according to the amount of current being supplied to each bit line at a decrease in a temperature.

10. The nonvolatile memory device of claim 9,
wherein the page buffer controlling circuit includes a reference voltage generator configured to generate a reference voltage under a control of a control logic; and
a temperature compensator configured to receive the reference voltage to generate a control signal having a voltage varied according to a temperature variation; and
wherein each of the page buffers comprises an NMOS transistor connected between a corresponding bit line and a sensing node and configured to operate responsive to the control signal;
a load unit configured to supply a current to the sensing node; and
a latch unit configured to latch a voltage level of the sensing node as cell data, a voltage of the control signal being increased at a decrease in a temperature such that the amount of current being supplied to a bit line is increased.

11. The nonvolatile memory device of claim 9, wherein the page buffer controlling circuit includes a temperature detector configured to generate a selection signal indicating whether a temperature of the nonvolatile memory device is lower than a reference temperature;
a reference voltage generator configured to generate a reference voltage under a control of a control logic;
a temperature compensator configured to receive the reference voltage and to generate a signal having a voltage varied according to a temperature variation; and
a selector configured to select one of the reference voltage and a voltage varied according to a temperature variation to output a control signal having the selected voltage; and
wherein each of the page buffers comprises an NMOS transistor connected between a corresponding bit line and a sensing node and configured to operate responsive to the control signal;
a load unit configured to supply a current to the sensing node; and
a latch unit configured to latch a voltage level of the sensing node as cell data, the voltage varied according to a temperature variation being increased at a decrease in a temperature such that the amount of current being supplied to a corresponding bit line is increased.

12. A memory card comprising:
at least one nonvolatile memory device according to claim 8;
a controller including a buffer memory and configured to control the nonvolatile memory device;
an interface unit configured to provide an interface function between the controller and an external device;
page buffers connected with bit lines corresponding to the strings, respectively; and
a page buffer controlling circuit configured to control the page buffers so as to adjust the amount of current being supplied to each bit line according to a temperature variation;
wherein the page buffer controlling circuit includes a reference voltage generator configured to generate a reference voltage under a control of a control logic; and
a temperature compensator configured to receive the reference voltage to generate a control signal having a voltage varied according to a temperature variation; and
wherein each of the page buffers comprises an NMOS transistor connected between a corresponding bit line and a sensing node and configured to operate responsive to the control signal;
a load unit configured to supply a current to the sensing node; and
a latch unit configured to latch a voltage level of the sensing node as cell data,
a voltage of the control signal being increased at a decrease in a temperature such that the amount of current being supplied to a corresponding bit line is increased.

13. A solid state drive comprising:
a storage medium including at least one of the nonvolatile memory device according to claim 8;
a controller connected with the storage medium via a plurality of channels and configured to control the storage medium;
page buffers connected with bit lines corresponding to the strings, respectively; and a page buffer controlling circuit configured to control the page buffers so as to adjust the amount of current being supplied to the bit lines according to a temperature variation;
wherein the page buffer controlling circuit includes a temperature detector configured to generate a selection signal indicating whether a temperature of the nonvolatile memory device is lower than a reference temperature;
a reference voltage generator configured to generate a reference voltage under a control of a control logic;
a temperature compensator configured to receive the reference voltage and to generate a signal having a voltage varied according to a temperature variation;
a selector configured to select one of the reference voltage and a voltage varied according to a temperature variation to output a control signal having the selected voltage; and wherein each of the page buffers comprises an NMOS transistor connected between a corresponding bit line and a sensing node and configured to operate responsive to the control signal;
a load unit configured to supply a current to the sensing node; and
a latch unit configured to latch a voltage level of the sensing node as cell data, the voltage varied according to a temperature variation being increased at a decrease in a temperature such that the amount of current being supplied to a corresponding bit line is increased.

14. A non-volatile memory device comprising:
an array including a plurality of memory cells,
each memory cell including a channel containing polycrystalline silicon;
a bit line connected to at least one of the plurality of memory cells; and
a bit line current controlling circuit configured to adjust a current supplied to the bit line in order to compensate for a temperature-current variation of the channel.

15. The memory device according to claim 14, wherein the bit line current controlling circuit includes:
a page buffer circuit connected to the bit line; and
a control signal generator configured to generate a control signal applied to the page buffer circuit,
the page buffer circuit being configured to adjust the current supplied to bit line based on the control signal.

16. The memory device according to claim 15, wherein
the control signal generator includes a reference voltage generator connected to a temperature compensator,
the reference voltage generator is configured to generate a reference voltage,
the temperature compensator is configured to generate a voltage of the control signal based on comparing a default temperature to a temperature sensed by the temperature compensator, and
wherein the temperature compensator is configured to generate the voltage of the control signal to be higher than the reference voltage when the temperature sensed by the temperature compensator is less than the default temperature.

17. The memory device according to claim 15, wherein
at least two memory cells of the plurality of memory cells are vertically stacked to form a string between a substrate and the bit line,
the channel of each of the at least two memory cells is a portion of a surface layer containing polycrystalline silicon that extends vertically between the substrate and the bit line,
an insulation material separates adjacent memory cells of the at least two memory cells along a height direction of the surface layer, and
each memory cell of the at least two memory cells includes,
a control gate and
at least one insulation layer between the control gate and the channel containing polycrystalline silicon.

* * * * *